United States Patent
Hurwitz et al.

(10) Patent No.: US 12,525,974 B2
(45) Date of Patent: Jan. 13, 2026

(54) SYSTEMS AND METHODS FOR OPERATING A SOLID-STATE RELAY SYSTEM

(71) Applicant: AIM Intelligent Machines, Inc., Monroe, WA (US)

(72) Inventors: Jonathan Hurwitz, Monroe, WA (US); Robert Kotlaba, Monroe, WA (US); Pavel Vurma, Litoměřice (CZ)

(73) Assignee: AIM Intelligent Machines, Inc., Monroe, WA (US)

( * ) Notice: Subject to any disclaimer, the term of this patent is extended or adjusted under 35 U.S.C. 154(b) by 3 days.

(21) Appl. No.: 18/463,178

(22) Filed: Sep. 7, 2023

(65) Prior Publication Data
US 2024/0364331 A1    Oct. 31, 2024

Related U.S. Application Data

(60) Provisional application No. 63/498,975, filed on Apr. 28, 2023.

(51) Int. Cl.
*H03K 17/687*    (2006.01)
*E02F 9/20*    (2006.01)
(Continued)

(52) U.S. Cl.
CPC ......... *H03K 17/6871* (2013.01); *H03K 17/60* (2013.01); *E02F 9/205* (2013.01); *E02F 9/24* (2013.01)

(58) Field of Classification Search
CPC ..... H03K 17/6871; H03K 17/60; E02F 9/205; E02F 9/24
(Continued)

(56) References Cited

U.S. PATENT DOCUMENTS 6,519,127 B1 * 2/2003 Check .............. H03K 17/6874
                                                      361/100
8,818,608 B2    8/2014 Cullinane et al.
(Continued)

FOREIGN PATENT DOCUMENTS

| WO | WO-2014165681 A1 | 10/2014 |
| WO | WO-2020131497 A1 | 6/2020 |
| WO | WO-2021178763 A1 | 9/2021 |

OTHER PUBLICATIONS

Maurer, Steffen et al. Designing a Guardian Angel: Giving an Automated Vehicle the Possibility to Override its Driver. AutomotiveUI '18: Proceedings of the 10th International Conference on Automotive User Interfaces and Interactive Vehicular Applications. Sep. 23, 2018. pp. 341-350. https://doi.org/10.1145/3239060.3239078.

*Primary Examiner* — Michael R. Fin
(74) *Attorney, Agent, or Firm* — Wilson Sonsini Goodrich & Rosati

(57) ABSTRACT

The present disclosure provides a solid-state relay system and a method of operating the solid-state relay system. The solid-state relay system includes a first solid-state device electrically connected to a first input, the first input electrically connected to a common node. The system includes a second solid-state device electrically connected to a second input, the second input electrically disconnected from the common node. The system includes a set of solid-state devices configured to, based at least in part on a trigger signal, electrically disconnect the first input from a common node and electrically connect the second input to the common node. The first solid-state device, the second solid-state device, and the set of solid-state devices are powered by the first input, the second input, and the trigger signal without using an external power source.

19 Claims, 10 Drawing Sheets

(51) Int. Cl.
  *E02F 9/24* (2006.01)
  *H03K 17/60* (2006.01)
(58) Field of Classification Search
  USPC .......................................................... 307/10.1
  See application file for complete search history.

(56) References Cited

U.S. PATENT DOCUMENTS

| | | |
|---|---|---|
| 8,825,258 B2 | 9/2014 | Cullinane et al. |
| 9,075,413 B2 | 7/2015 | Cullinane et al. |
| 9,342,074 B2 | 5/2016 | Dolgov et al. |
| 9,352,752 B2 | 5/2016 | Cullinane et al. |
| 9,511,779 B2 | 12/2016 | Cullinane et al. |
| 9,663,117 B2 | 5/2017 | Cullinane et al. |
| 9,821,818 B2 | 11/2017 | Cullinane et al. |
| 10,000,216 B2 | 6/2018 | Cullinane et al. |
| 10,300,926 B2 | 5/2019 | Cullinane et al. |
| 10,529,221 B2 | 1/2020 | Jarrell et al. |
| 10,864,917 B2 | 12/2020 | Cullinane et al. |
| 11,643,099 B2 | 5/2023 | Cullinane et al. |
| 11,782,186 B2 | 10/2023 | Brown |
| 11,790,760 B2 | 10/2023 | Brown et al. |
| 11,790,762 B2 | 10/2023 | Brown |
| 12,094,324 B2 | 9/2024 | Brown |
| 12,168,448 B2 | 12/2024 | Cullinane et al. |
| 2003/0218387 A1* | 11/2003 | Higgins ................. H01H 3/141 307/119 |
| 2020/0217468 A1 | 7/2020 | Brown et al. |
| 2021/0279661 A1 | 9/2021 | Subramanian et al. |
| 2022/0043441 A1 | 2/2022 | Huang et al. |
| 2025/0178623 A1 | 6/2025 | Cullinane et al. |

\* cited by examiner

SYSTEMS AND METHODS FOR OPERATING A SOLID-STATE RELAY SYSTEM

CROSS REFERENCE

This application claims the benefit of priority to U.S. Provisional Application No. 63/498,975, filed Apr. 28, 2023, the content of which is incorporated herein in its entirety.

BACKGROUND

Typical earth-moving vehicles (EMVs), such as excavators, are human-operated for moving dirt and other materials on the ground. The operator typically uses a joystick inside a cab of the EMV to effect movement of various components (e.g., a boom, an arm, and a bucket) of the EMV. The joystick is typically connected to a safety lever that blocks hydraulics on the joystick. When the operator detects a dangerous or emergency situation and pulls the safety lever, and the blocked hydraulics prevents the various components from further movement.

SUMMARY

Recognized herein are various limitations with currently available technologies. Typical EMVs, such as excavators, include one or more safety features such as a safety lever that allows an operator to disable the EMV or its components from moving when an emergency situation is perceived by the operator (e.g., when the joystick does not detect a hand controlling the joystick). While this can be a helpful feature in human-operated EMVs, this feature can prevent an artificial intelligence (AI)-operated EMV from operating completely, since a human operator is not present in the cab of an AI-operated EMV. Accordingly, there is a need for an AI-operated EMV to move without triggering certain safety features.

The present disclosure addresses at least the above mentioned shortcomings of conventional systems and methods to operate the EMV with AI by using solid-state relays to override the safety features of a typical EMV. The systems and methods disclosed herein have several advantages. For example, the solid-state relay system does not require moving parts like a mechanical relay system (e.g., no switching based at least in part on energizing a coil) and is therefore more reliable and easier to install. Also, embodiments of the present disclosure provide better electromagnetic protection of the engine control unit (ECU), used as a controller for the engine, in the event of a signal spike and extensive noises. Additionally, embodiments can support high current signals (e.g., greater than or equal to 50 Amps (A). Furthermore, various modifications can be made depending on the load by designing the system with different resistors and/or size of the PCB traces.

In one aspect, a solid-state relay system comprises a first solid-state device electrically connected to a first input, wherein the first input is electrically connected to a common node, a second solid-state device electrically connected to a second input, wherein the second input is electrically disconnected from the common node, and a set of solid-state devices configured to, based at least in part on a trigger signal, electrically disconnect the first input from a common node and electrically connect the second input to the common node. The first solid-state device, the second solid-state device, and the set of solid-state devices are powered by the first input, the second input, and the trigger signal without using an external power source.

In some embodiments, one or more of the first input, the second input, and the trigger signal are polarity protected.

In some embodiments, the set of solid-state devices comprises a third solid-state device configured to, based at least in part on the trigger signal, turn on when a fourth solid-state device of the set of solid-state devices is turned on.

In some embodiments, the first solid-state device is configured to turn off when the third solid-state device is turned on.

In some embodiments, the set of solid-state devices comprises a fifth solid-state device configured to turn on when the third solid-state device is turned on.

In some embodiments, the set of solid-state devices comprises a sixth solid-state device configured to turn on when the fifth solid-state device is turned on.

In some embodiments, the second solid-state device is configured to turn on when the sixth solid-state device is turned on.

In some embodiments, the fourth solid-state device is configured to turn on when a first light-emitting diode (LED) is turned on based at least in part on the trigger signal, wherein the fifth solid-state device is configured to turn on when a second LED is turned on based at least in part on the trigger signal.

In some embodiments, the fourth solid-state device and the first LED form a first opto-coupler, and the fifth solid-state device and the second LED form a second opto-coupler.

In some embodiments, each of the first and second LEDs is configured to emit a light having a wavelength in an infrared range.

In some embodiments, the set of solid-state devices comprises a third solid-state device configured to receive the trigger signal, and wherein the second solid-state device is configured, based at least in part on the trigger signal, turn on when the third solid-state device is turned on.

In some embodiments, the set of solid-state devices comprises a fourth solid-state device configured to receive the trigger signal, and wherein the first solid-state device is configured to, based at least in part on the trigger signal, turn off when the fourth solid-state device is turned on.

In some embodiments, a voltage level of the first input is greater than a voltage level of the common node in a first mode and the voltage level of the common node is greater than the voltage level of the first input in a second mode, wherein a voltage level of the second input is greater than the voltage level of the common signal in a first mode and the voltage level of the common node is greater than the voltage level of the second input in a second mode.

In some embodiments, the system further comprises a first diode electrically connected to the first solid-state device and the common node.

In some embodiments, the system further comprises a second diode electrically connected to the first input, wherein the set of solid-state devices comprises a seventh solid-state device electrically connected to the second diode and the common node.

In some embodiments, the system further comprises a third diode electrically connected to the common node and the second solid-state device.

In some embodiments, the system further comprises a fourth diode electrically connected to the second input, wherein the set of solid-state devices comprises an eighth solid-state device electrically connected to the fourth diode and the common node.

In some embodiments, the system further comprises a fifth diode electrically connected to the first input, a sixth diode electrically connected to the second input, and a seventh diode electrically connected to the common node, wherein the fifth, sixth and seventh diodes are electrically connected to one another.

In some embodiments, the first and second solid-state devices and the set of solid-state devices are powered by one or more of the first input, second input, and/or the trigger signal, without an external power source.

In some embodiments, each of the one or more diodes includes a Zener diode, a rectifier diode, or a transient voltage suppressor.

In some embodiments, the first, second, and set of solid-state devices each includes a transistor including a bipolar junction transistor (BJT) or a metal-oxide-semiconductor field-effect transistor (MOSFET).

In some embodiments, the BJT includes an NPN transistor, and wherein the MOSFET includes an n-type transistor.

In some embodiments, the set of solid-state devices configured to, when there is no trigger signal, electrically disconnect the second input from the common node and electrically connect the first input to the common node.

Another aspect is a method, comprising: electrically connecting a first solid-state device to a first input that is electrically connected to a common node; electrically connecting a second solid-state device to a second input that is electrically disconnected from the common node; electrically disconnecting, via a set of solid-state devices based at least in part on a trigger signal, the first input from the common node; and electrically connecting the second input to the common node, wherein the first solid-state device, the second solid-state device, and the set of solid-state devices are powered by the first input, the second input, and the trigger signal without using an external power source.

In some embodiments, the method further includes turning on a third solid-state device of the set of solid-state devices, based at least in part on the trigger signal, when a fourth solid-state device of the set of solid-state devices is turned on.

In some embodiments, the method further includes turning off the first solid-state device when the third state device is turned on.

In some embodiments, the method further includes turning on a fifth solid-state device of the set of solid-state devices when the third solid-state device is turned on.

In some embodiments, the method further includes turning on a sixth solid-state device of the set of solid-state devices when the fifth solid-state device is turned on.

In some embodiments, the method further includes turning on the second solid-state device when the sixth solid-state device is turned on.

In some embodiments, the method further includes turning on the fourth solid-state device and a first light-emitting diode (LED) based at least in part on the trigger signal; and turning on the fifth solid-state device and a second LED based at least in part on the trigger signal, wherein the fourth solid-state device and the first LED form a first opto-coupler, and the fifth solid-state device and the second LED form a second opto-coupler.

In some embodiments, each of the first LED and the second LED is configured to emit light having a wavelength in an infrared range.

In some embodiments, the method further includes turning on, based at least in part on the trigger signal, a third solid-state device of the set of solid-state devices, and turning on the second solid-state device when the third solid-state device is turned on.

In some embodiments, the method further includes turning on, based at least in part on the trigger signal, a fourth solid-state device of the set of solid-state device, and turning off the first solid-state device when the fourth solid-state device is turned on.

In some embodiments, the method further includes providing power to a system including the first, second, and set of solid-state devices via the first and second inputs and the trigger signal.

Another aspect is a system, comprising: a first solid-state relay configured to operate in a normally closed mode or a normally open mode; a second solid-state relay connected to the first solid-state relay and configured to operate as a normally open cable during the normally open mode; a third solid-state relay connected to the first and second relays and configured to operate as a normally closed cable during the normally closed mode; and a fourth solid-state relay connected to the first, second, and third solid-state relays and configured to switch the first solid-state relay between the normally closed mode and a normally open mode.

In some embodiments, one or more of the first to fourth solid-state relays include solid-state devices.

In some embodiments, the system further comprises an activation switch configured to toggle between a human-operated mode and an artificial intelligence (AI)-operated mode.

In some embodiments, during the AI-operated mode, the first, second, and third relays are further configured to stop an earth-moving vehicle (EMV) in an emergency.

In some embodiments, during the AI-operated mode, the first, second, and third relays are further configured to bypass a safety lever connected to a joystick of an EMV.

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings (also "Figure" and "FIG." herein), of which:

DETAILED DESCRIPTION

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

Whenever the term "at least," "greater than," or "greater than or equal to" precedes the first numerical value in a series of two or more numerical values, the term "at least," "greater than" or "greater than or equal to" applies to each of the numerical values in that series of numerical values. For example, greater than or equal to 1, 2, or 3 is equivalent to greater than or equal to 1, greater than or equal to 2, or greater than or equal to 3.

Whenever the term "no more than," "less than," or "less than or equal to" precedes the first numerical value in a series of two or more numerical values, the term "no more than," "less than," or "less than or equal to" applies to each of the numerical values in that series of numerical values. For example, less than or equal to 3, 2, or 1 is equivalent to less than or equal to 3, less than or equal to 2, or less than or equal to 1.

The term "real time" or "real-time," as used interchangeably herein, generally refers to an event (e.g., an operation, a process, a method, a technique, a computation, a calculation, an analysis, a visualization, an optimization, etc.) that is performed using recently obtained (e.g., collected or received) data. In some cases, a real time event may be performed almost immediately or within a short enough time span, such as within at least 0.0001 millisecond (ms), 0.0005 ms, 0.001 ms, 0.005 ms, 0.01 ms, 0.05 ms, 0.1 ms, 0.5 ms, 1 ms, 5 ms, 0.01 seconds, 0.05 seconds, 0.1 seconds, 0.5 seconds, 1 second, or more. In some cases, a real time event may be performed almost immediately or within a short enough time span, such as within at most 1 second, 0.5 seconds, 0.1 seconds, 0.05 seconds, 0.01 seconds, 5 ms, 1 ms, 0.5 ms, 0.1 ms, 0.05 ms, 0.01 ms, 0.005 ms, 0.001 ms, 0.0005 ms, 0.0001 ms, or less.

Computing System

Figure 1:
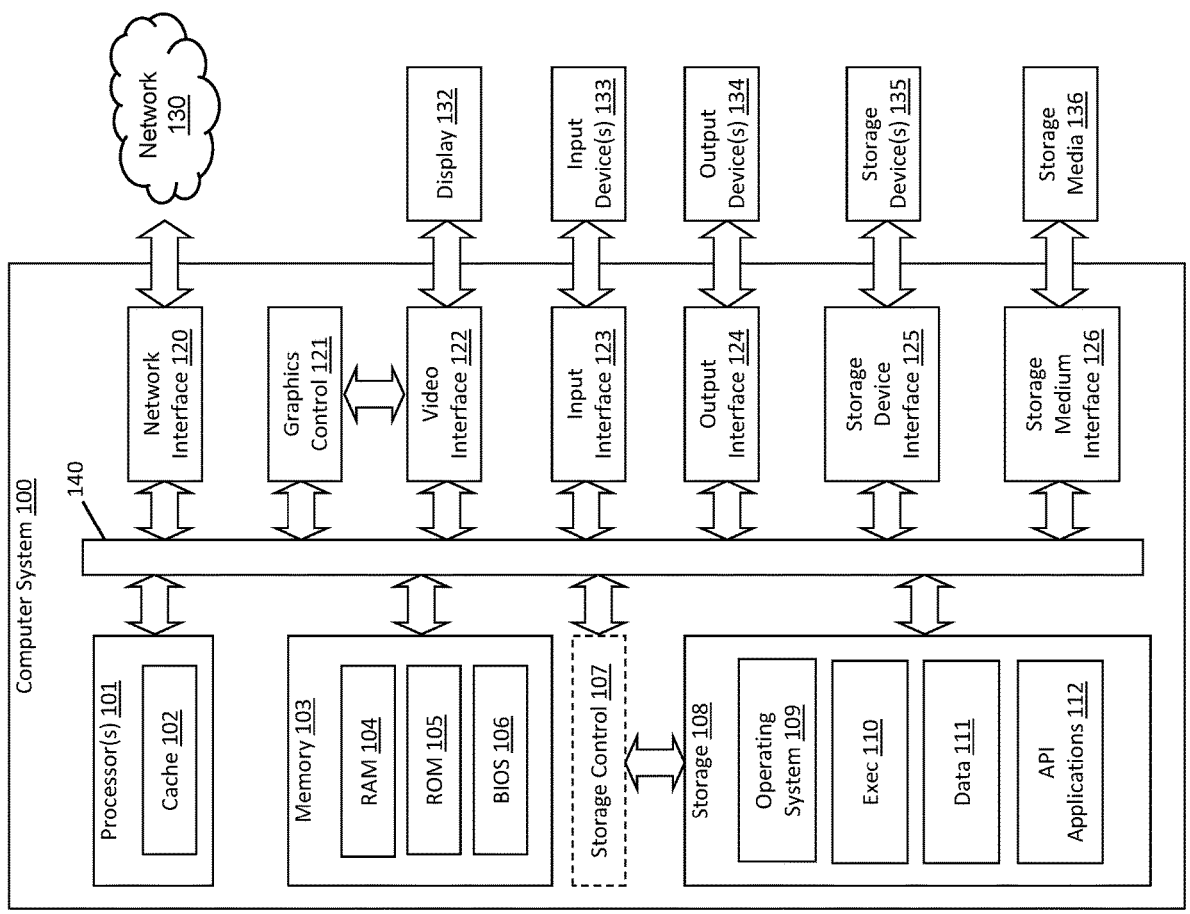
FIG. 1 shows a non-limiting example of a computing device; in this case, a device with one or more processors, memory, storage, and a network interface, in accordance with some embodiments.

Referring to FIG. 1, a block diagram is shown depicting an exemplary machine that includes a computer system 100 (e.g., a processing or computing system) within which a set of instructions can execute for causing a device to perform or execute any one or more of the aspects and/or methodologies for static code scheduling of the present disclosure. The components in FIG. 1 are examples only and do not limit the scope of use or functionality of any hardware, software, embedded logic component, or a combination of two or more such components implementing particular embodiments.

Computer system 100 may include one or more processors 101, a memory 103, and a storage 108 that communicate with each other, and with other components, via a bus 140. The bus 140 may also link a display 132, one or more input devices 133 (which may, for example, include a keypad, a keyboard, a mouse, a stylus, etc.), one or more output devices 134, one or more storage devices 135, and various tangible storage media 136. All of these elements may interface directly or via one or more interfaces or adaptors to the bus 140. For instance, the various tangible storage media 136 can interface with the bus 140 via storage medium interface 126. Computer system 100 may have any suitable physical form, including but not limited to one or more integrated circuits (ICs), printed circuit boards (PCBs), laptop or notebook computers, distributed computer systems, computing grids, or servers.

Computer system 100 includes one or more processor(s) 101 (e.g., central processing units (CPUs), general purpose graphics processing units (GPGPUs), or quantum processing units (QPUs)) that carry out functions. Processor(s) 101 optionally contains a cache memory unit 102 for temporary local storage of instructions, data, or computer addresses. Processor(s) 101 are configured to assist in execution of computer readable instructions. Computer system 100 may provide functionality for the components depicted in FIG. 1 as a result of the processor(s) 101 executing non-transitory, processor-executable instructions embodied in one or more tangible computer-readable storage media, such as memory 103, storage 108, storage devices 135, and/or storage medium 136. The computer-readable media may store software that implements particular embodiments, and processor(s) 101 may execute the software. Memory 103 may read the software from one or more other computer-readable media (such as mass storage device(s) 135, 136) or from one or more other sources through a suitable interface, such as network interface 120. The software may cause processor(s) 101 to carry out one or more processes or one or more steps of one or more processes described or illustrated herein. Carrying out such processes or steps may include defining data structures stored in memory 103 and modifying the data structures as directed by the software.

The memory 103 may include various components (e.g., machine readable media) including, but not limited to, a random access memory component (e.g., RAM 104) (e.g., static RAM (SRAM), dynamic RAM (DRAM), ferroelectric random access memory (FRAM), phase-change random access memory (PRAM), etc.), a read-only memory component (e.g., ROM 105), and any combinations thereof. ROM 105 may act to communicate data and instructions unidirectionally to processor(s) 101, and RAM 104 may act to communicate data and instructions bidirectionally with processor(s) 101. ROM 105 and RAM 104 may include any suitable tangible computer-readable media described below. In one example, a basic input/output system 106 (BIOS), including basic routines that help to transfer information between elements within computer system 100, such as during start-up, may be stored in the memory 103.

Fixed storage 108 is connected bidirectionally to processor(s) 101, optionally through storage control unit 107. Fixed storage 108 provides additional data storage capacity and may also include any suitable tangible computer-readable media described herein. Storage 108 may be used to store operating system 109, executable(s) 110, data 111, applications 112 (application programs), and the like. Storage 108 can also include an optical disk drive, a solid-state memory device (e.g., flash-based systems), or a combination of any of the above. Information in storage 108 may, in appropriate cases, be incorporated as virtual memory in memory 103.

In one example, storage device(s) 135 may be removably interfaced with computer system 100 (e.g., via an external port connector (not shown)) via a storage device interface 125. Particularly, storage device(s) 135 and an associated machine-readable medium may provide non-volatile and/or volatile storage of machine-readable instructions, data structures, program modules, and/or other data for the computer system 100. In one example, software may reside, completely or partially, within a machine-readable medium on storage device(s) 135. In another example, software may reside, completely or partially, within processor(s) 101.

Bus 140 connects a wide variety of subsystems. Herein, reference to a bus may encompass one or more digital signal lines serving a common function, where appropriate. Bus 140 may be any of several types of bus structures including, but not limited to, a memory bus, a memory controller, a peripheral bus, a local bus, and any combinations thereof, using any of a variety of bus architectures. As an example and not by way of limitation, such architectures include an Industry Standard Architecture (ISA) bus, an Enhanced ISA (EISA) bus, a Micro Channel Architecture (MCA) bus, a Video Electronics Standards Association local bus (VLB), a Peripheral Component Interconnect (PCI) bus, a PCI-Express (PCI-X) bus, an Accelerated Graphics Port (AGP) bus, HyperTransport (HTX) bus, serial advanced technology attachment (SATA) bus, and any combinations thereof.

Computer system 100 may also include an input device 133. In one example, a user of computer system 100 may enter commands and/or other information into computer system 100 via input device(s) 133. Examples of an input device(s) 133 include, but are not limited to, an alpha-numeric input device (e.g., a keyboard), a pointing device (e.g., a mouse or touchpad), a touchpad, a touch screen, a multi-touch screen, a joystick, a stylus, an audio input device (e.g., a microphone, a voice response system, etc.), an optical scanner, a video or still image capture device (e.g., a camera), and any combinations thereof. In some embodiments, the input device is a Kinect, Leap Motion, or the like. Input device(s) 133 may be interfaced to bus 140 via any of a variety of input interfaces 123 (e.g., input interface 123) including, but not limited to, serial, parallel, USB, FIRE-WIRE, THUNDERBOLT, or any combination of the above.

In particular embodiments, when computer system 100 is connected to network 130, computer system 100 may communicate with other devices, specifically mobile devices and enterprise systems, distributed computing systems, cloud storage systems, cloud computing systems, and the like, connected to network 130. Communications to and from computer system 100 may be sent through network interface 120. For example, network interface 120 may receive incoming communications (such as requests or responses from other devices) in the form of one or more packets (such as Internet Protocol (IP) packets) from network 130, and computer system 100 may store the incoming communications in memory 103 for processing Computer system 100 may similarly store outgoing communications (such as requests or responses to other devices) in the form of one or more packets in memory 103 and communicated to network 130 from network interface 120. Processor(s) 101 may access these communication packets stored in memory 103 for processing.

Examples of the network interface 120 include, but are not limited to, a network interface card, a modem, and any combination thereof. Examples of a network 130 or network segment 130 include, but are not limited to, a distributed computing system, a cloud computing system, a wide area network (WAN) (e.g., the Internet, an enterprise network), a local area network (LAN) (e.g., a network associated with an office, a building, a campus or other relatively small geographic space), a telephone network, a direct connection between two computing devices, a peer-to-peer network, and any combinations thereof. A network, such as network 130, may employ a wired and/or a wireless mode of communication. In general, any network topology may be used.

Information and data can be displayed through a display 132. Examples of a display 132 include, but are not limited to, a cathode ray tube (CRT), a liquid crystal display (LCD), a thin film transistor liquid crystal display (TFT-LCD), an organic liquid crystal display (OLED) such as a passive-matrix OLED (PMOLED) or active-matrix OLED (AMO-LED) display, a plasma display, and any combinations thereof. The display 132 can interface to the processor(s) 101, memory 103, and fixed storage 108, as well as other devices, such as input device(s) 133, via the bus 140. The display 132 is linked to the bus 140 via a video interface 122, and transport of data between the display 132 and the bus 140 can be controlled via the graphics control 121. In some embodiments, the display is a video projector. In some embodiments, the display is a head-mounted display (HMD) such as a VR headset. In further embodiments, suitable VR headsets include, by way of non-limiting examples, HTC Vive, Oculus Rift, Samsung Gear VR, Microsoft HoloLens, Razer OSVR, FOVE VR, Zeiss VR One, Avegant Glyph, Freefly VR headset, and the like. In still further embodiments, the display is a combination of devices such as those disclosed herein.

In addition to a display 132, computer system 100 may include one or more other peripheral output devices 134 including, but not limited to, an audio speaker, a printer, a storage device, and any combinations thereof. Such peripheral output devices may be connected to the bus 140 via an output interface 124. Examples of an output interface 124 include, but are not limited to, a serial port, a parallel connection, a USB port, a FIREWIRE port, a THUNDER-BOLT port, and any combinations thereof.

In addition or as an alternative, computer system 100 may provide functionality as a result of logic hardwired or otherwise embodied in a circuit, which may operate in place of or together with software to execute one or more processes or one or more steps of one or more processes described or illustrated herein. Reference to software in this disclosure may encompass logic, and reference to logic may encompass software. Moreover, reference to a computer-readable medium may encompass a circuit (such as an IC) storing software for execution, a circuit embodying logic for execution, or both, where appropriate. The present disclosure encompasses any suitable combination of hardware, software, or both.

Those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by one or more processor(s), or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In accordance with the description herein, suitable computing devices include, by way of non-limiting examples, server computers, desktop computers, laptop computers, notebook computers, sub-notebook computers, netbook computers, netpad computers, media streaming devices, handheld computers, Internet appliances, tablet computers, personal digital assistants, and vehicles. Those of skill in the art will also recognize that select televisions, video players, and digital music players with optional computer network connectivity are suitable for use in the system described herein. Suitable tablet computers, in various embodiments, include those with booklet, slate, and convertible configurations, known to those of skill in the art.

In some embodiments, the computing device includes an operating system configured to perform executable instructions. The operating system is, for example, software, including programs and data, which manages the device's hardware and provides services for execution of applications. Those of skill in the art will recognize that suitable server operating systems include, by way of non-limiting examples, FreeBSD, OpenBSD, NetBSD®, Linux, Apple® Mac OS X Server®, Oracle® Solaris®, Windows Server®, and Novell® NetWare® Those of skill in the art will recognize that suitable personal computer operating systems include, by way of non-limiting examples, Microsoft Windows®, Apple Mac OS X®, UNIX®, and UNIX-like operating systems such as GNU/Linux®. In some embodiments, the operating system is provided by cloud computing.

Non-Transitory Computer Readable Storage Medium

In some embodiments, the platforms, systems, media, and methods disclosed herein include one or more non-transitory computer readable storage media encoded with a program including instructions executable by the operating system of an optionally networked computing device. In further embodiments, a computer readable storage medium is a tangible component of a computing device. In still further embodiments, a computer readable storage medium is optionally removable from a computing device. In some embodiments, a computer readable storage medium includes, by way of non-limiting examples, CD-ROMs, DVDs, flash memory devices, solid-state memory, magnetic disk drives, magnetic tape drives, optical disk drives, distributed computing systems including cloud computing systems and services, and the like. In some cases, the program and instructions are permanently, substantially permanently, semi-permanently, or non-transitorily encoded on the media.

Computer Program

In some embodiments, the platforms, systems, media, and methods disclosed herein include at least one computer program, or use of the same. A computer program includes a sequence of instructions, executable by one or more processor(s) of the computing device's CPU, written to perform a specified task. Computer readable instructions may be implemented as program modules, such as functions, objects, Application Programming Interfaces (APIs), computing data structures, and the like, that perform particular tasks or implement particular abstract data types. In light of the disclosure provided herein, those of skill in the art will recognize that a computer program may be written in various versions of various languages.

The functionality of the computer readable instructions may be combined or distributed as desired in various environments. In some embodiments, a computer program comprises one sequence of instructions. In some embodiments, a computer program comprises a plurality of sequences of instructions. In some embodiments, a computer program is provided from one location. In other embodiments, a computer program is provided from a plurality of locations. In various embodiments, a computer program includes one or more software modules. In various embodiments, a computer program includes, in part or in whole, one or more web applications, one or more mobile applications, one or more standalone applications, extensions, add-ins, or add-ons, or combinations thereof.

Web Application

In some embodiments, a computer program includes a web application. In light of the disclosure provided herein, those of skill in the art will recognize that a web application, in various embodiments, utilizes one or more software frameworks and one or more database systems. In some embodiments, a web application is created upon a software framework such as Microsoft® .NET or Ruby on Rails (RoR). In some embodiments, a web application utilizes one or more database systems including, by way of non-limiting examples, relational, non-relational, object oriented, associative, XML, and document oriented database systems. In further embodiments, suitable relational database systems include, by way of non-limiting examples, Microsoft SQL Server, mySQL™, and Oracle®. Those of skill in the art will also recognize that a web application, in various embodiments, is written in one or more versions of one or more languages. A web application may be written in one or more markup languages, presentation definition languages, client-side scripting languages, server-side coding languages, database query languages, or combinations thereof. In some embodiments, a web application is written to some extent in a markup language such as Hypertext Markup Language (HTML), Extensible Hypertext Markup Language (XHTML), or extensible Markup Language (XML). In some embodiments, a web application is written to some extent in a presentation definition language such as Cascading Style Sheets (CSS). In some embodiments, a web application is written to some extent in a client-side scripting language such as Asynchronous Javascript and XML (AJAX), Flash® ActionScript, JavaScript, or Silverlight®. In some embodiments, a web application is written to some extent in a server-side coding language such as Active Server Pages (ASP), ColdFusion®, Perl, Java™, JavaServer Pages (JSP), Hypertext Preprocessor (PHP), Python™, Ruby, Tcl, Smalltalk, WebDNA®, or Groovy. In some embodiments, a web application is written to some extent in a database query language such as Structured Query Language (SQL). In some embodiments, a web application integrates enterprise server products such as IBM® Lotus Domino®. In some embodiments, a web application includes a media player element. In various further embodiments, a media player element utilizes one or more of many suitable multimedia technologies including, by way of non-limiting examples, Adobe® Flash®, HTML 5, Apple® QuickTime®, Microsoft® Silverlight®, Java™, and Unity®.

Figure 2:
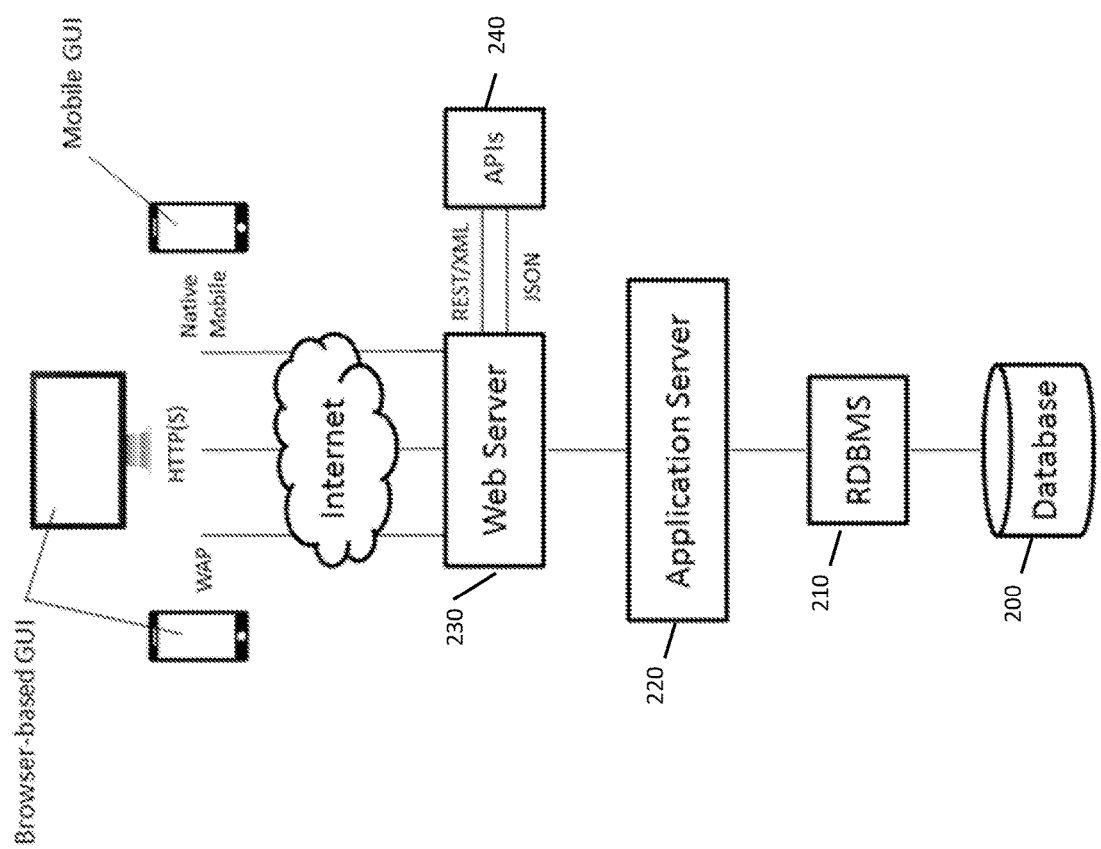
FIG. 2 shows a non-limiting example of a web/mobile application provision system; in this case, a system providing browser-based and/or native mobile user interfaces, in accordance with some embodiments.

Referring to FIG. 2, in a particular embodiment, an application provision system comprises one or more databases 200 accessed by a relational database management system (RDBMS) 210. Suitable RDBMSs include Firebird, MySQL, PostgreSQL, SQLite, Oracle Database, Microsoft SQL Server, IBM DB2, IBM Informix, SAP Sybase, Teradata, and the like. In this embodiment, the application provision system further comprises one or more application servers 220 (such as Java servers, .NET servers, PHP servers, and the like) and one or more web servers 230 (such as Apache, IIS, GWS and the like). The web server(s) optionally expose one or more web services via app application programming interfaces (APIs) 240. Via a network, such as the Internet, the system provides browser-based and/or mobile native user interfaces.

Figure 3:
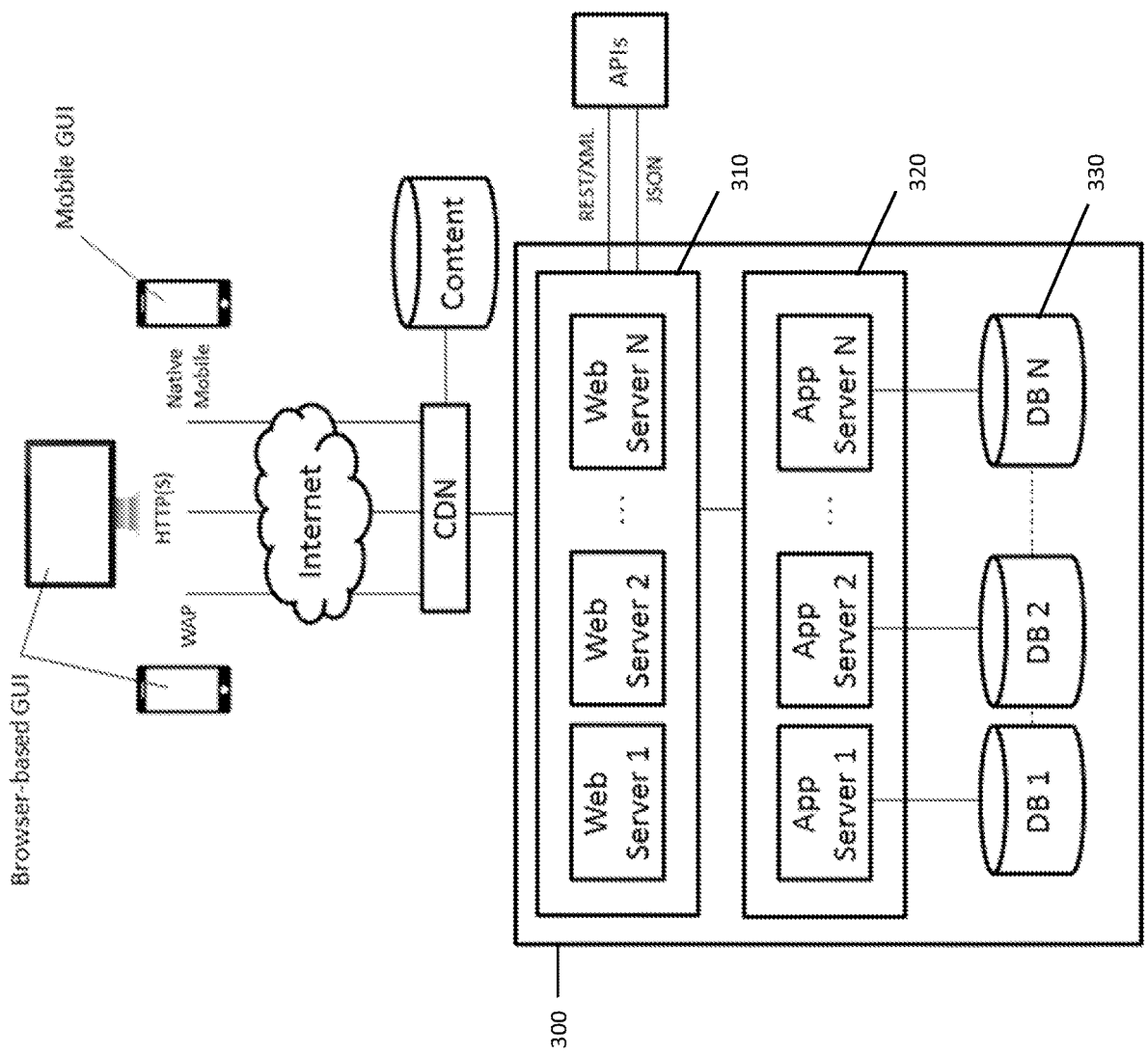
FIG. 3 shows a non-limiting example of a cloud-based web/mobile application provision system; in this case, a system comprising an elastically load balanced, auto-scaling web server and application server resources as well as synchronously replicated databases, in accordance with some embodiments.

Referring to FIG. 3, in a particular embodiment, an application provision system alternatively has a distributed, cloud-based architecture 300 and comprises elastically load balanced, auto-scaling web server resources 310 and application server resources 320 as well synchronously replicated databases 330.

Mobile Application

In some embodiments, a computer program includes a mobile application provided to a mobile computing device. In some embodiments, the mobile application is provided to a mobile computing device at the time it is manufactured. In other embodiments, the mobile application is provided to a mobile computing device via the computer network described herein.

In view of the disclosure provided herein, a mobile application is created by techniques known to those of skill in the art using hardware, languages, and development environments known to the art. Those of skill in the art will recognize that mobile applications are written in several languages. Suitable programming languages include, by way of non-limiting examples, C, C++, C#, Objective-C, Java™, JavaScript, Pascal, Object Pascal, Python™, Ruby, VB.NET, WML, and XHTML/HTML with or without CSS, or combinations thereof.

Suitable mobile application development environments are available from several sources. Commercially available development environments include, by way of non-limiting examples, AirplaySDK, alcheMo, Appcelerator®, Celsius, Bedrock, Flash Lite, .NET Compact Framework, Rhomobile, and WorkLight Mobile Platform. Other development environments are available without cost including, by way of non-limiting examples, Lazarus, MobiFlex, MoSync, and PhoneGap. Also, mobile device manufacturers distribute software developer kits including, by way of non-limiting examples, iPhone and iPad (iOS) SDK, Android™ SDK, BlackBerry® SDK, BREW SDK, Palm® OS SDK, Symbian SDK, webOS SDK, and Windows® Mobile SDK.

Those of skill in the art will recognize that several commercial forums are available for distribution of mobile applications including, by way of non-limiting examples, Apple® App Store, Google® Play, Chrome WebStore, BlackBerry® App World, App Store for Palm devices, App Catalog for webOS, Windows® Marketplace for Mobile, Ovi Store for Nokia® devices, Samsung® Apps, and Nintendo® DSi Shop.

Standalone Application

In some embodiments, a computer program includes a standalone application, which is a program that is run as an independent computer process, not an add-on to an existing process, e.g., not a plug-in. Those of skill in the art will recognize that standalone applications are often compiled. A compiler is a computer program(s) that transforms source code written in a programming language into binary object code such as assembly language or machine code. Suitable compiled programming languages include, by way of non-limiting examples, C, C++, Objective-C, COBOL, Delphi, Eiffel, Java™, Lisp, Python™, Visual Basic, and VB.NET, or combinations thereof. Compilation is often performed, at least in part, to create an executable program. In some embodiments, a computer program includes one or more executable compiled applications.

Software Modules

In some embodiments, the platforms, systems, media, and methods disclosed herein include software, server, and/or database modules, or use of the same. In view of the disclosure provided herein, software modules are created by techniques known to those of skill in the art using machines, software, and languages known to the art. The software modules disclosed herein are implemented in a multitude of ways. In various embodiments, a software module comprises a file, a section of code, a programming object, a programming structure, a distributed computing resource, a cloud computing resource, or combinations thereof. In further various embodiments, a software module comprises a plurality of files, a plurality of sections of code, a plurality of programming objects, a plurality of programming structures, a plurality of distributed computing resources, a plurality of cloud computing resources, or combinations thereof. In various embodiments, the one or more software modules comprise, by way of non-limiting examples, a web application, a mobile application, a standalone application, and a distributed or cloud computing application. In some embodiments, software modules are in one computer program or application. In other embodiments, software modules are in more than one computer program or application. In some embodiments, software modules are hosted on one machine. In other embodiments, software modules are hosted on more than one machine. In further embodiments, software modules are hosted on a distributed computing platform such as a cloud computing platform. In some embodiments, software modules are hosted on one or more machines in one location. In other embodiments, software modules are hosted on one or more machines in more than one location.

Databases

In some embodiments, the platforms, systems, media, and methods disclosed herein include one or more databases, or use of the same. In view of the disclosure provided herein, those of skill in the art will recognize that many databases are suitable for storage and retrieval of, for example, user, media, prompt, summary, curricula, review, survey, check-in, well-being index, token, and marketplace information. In various embodiments, suitable databases include, by way of non-limiting examples, relational databases, non-relational databases, object oriented databases, object databases, entity-relationship model databases, associative databases, XML databases, document oriented databases, and graph databases. Further non-limiting examples include SQL, PostgreSQL, MySQL, Oracle, DB2, Sybase, and MongoDB. In some embodiments, a database is Internet-based. In further embodiments, a database is web-based. In still further embodiments, a database is cloud computing-based. In a particular embodiment, a database is a distributed database. In other embodiments, a database is based at least in part on one or more local computer storage devices.

Mechanical Relays

A relay is an electrically operated switch. Relays are used in a wide range of applications, including automotive, industrial, and home automation systems. They can be used to control high voltage or high current loads with a low voltage control signal, to isolate electrical circuits, and to amplify weak signals.

A relay can include multiple configurations One configuration is a single pole double throw (SPDT) configuration which includes two terminals that can be connected or disconnected based at least in part on one input. The SPDT configuration can be implemented using a 5-pin relay, which includes a coil, 5 terminals, and a mechanical spring-loaded armature. The coil is energized with a low voltage electrical current, which creates a magnetic field. When the magnetic field is strong enough, it activates the armature, which closes or opens the circuit at the terminals.

The 5 terminals on a 5-pin relay have the following terminals: (1) common (COM) terminal which connects to the load (e.g., a light bulb). The common terminal is either connected to a normally closed (NC) terminal or a normally open (NO) terminal, depending on the position of the armature; (2) normally closed (NC) terminal which is connected to the common terminal when the relay is not energized. When the relay is energized, the armature opens the circuit between the common and NC terminals; (3) normally open (NO) terminal which is not connected to the common terminal when the relay is not energized, and when the relay is energized, the armature closes the circuit between the common and NO terminals; (4) trigger (TRG) terminal which is the terminal that receives the low voltage electrical current from a control circuit (e.g., a microcontroller or a switch). When the control circuit supplies current to the CTL terminal, it energizes the coil and activates the armature; and (5) ground (GND) terminal which is connected to the ground of the control circuit and used to complete the electrical circuit between the control circuit and the relay.

Solid-State Relays

Embodiments of the present disclosure include a solid-state relay, systems including solid-state relays, and methods of using solid-state relays. A solid-state relay can function similarly to a mechanical relay but does not include moving parts such as the armature. Instead, the solid-state relay can include solid-state components such as transistors and diodes to act as a switch. In some embodiments, AI-operated systems can be controlled by the computing system of FIGS. 1-3. In some embodiments, the AI-operated systems can control one or more solid-state relays or control the inputs that drive the solid-state relays. In some embodiments, a human operator can control he one or more solid state relays or the inputs that drive the solid state relays. In some embodiments, the EMV may be operated by the AI-operated systems and the human operator at different times.

Figure 4:
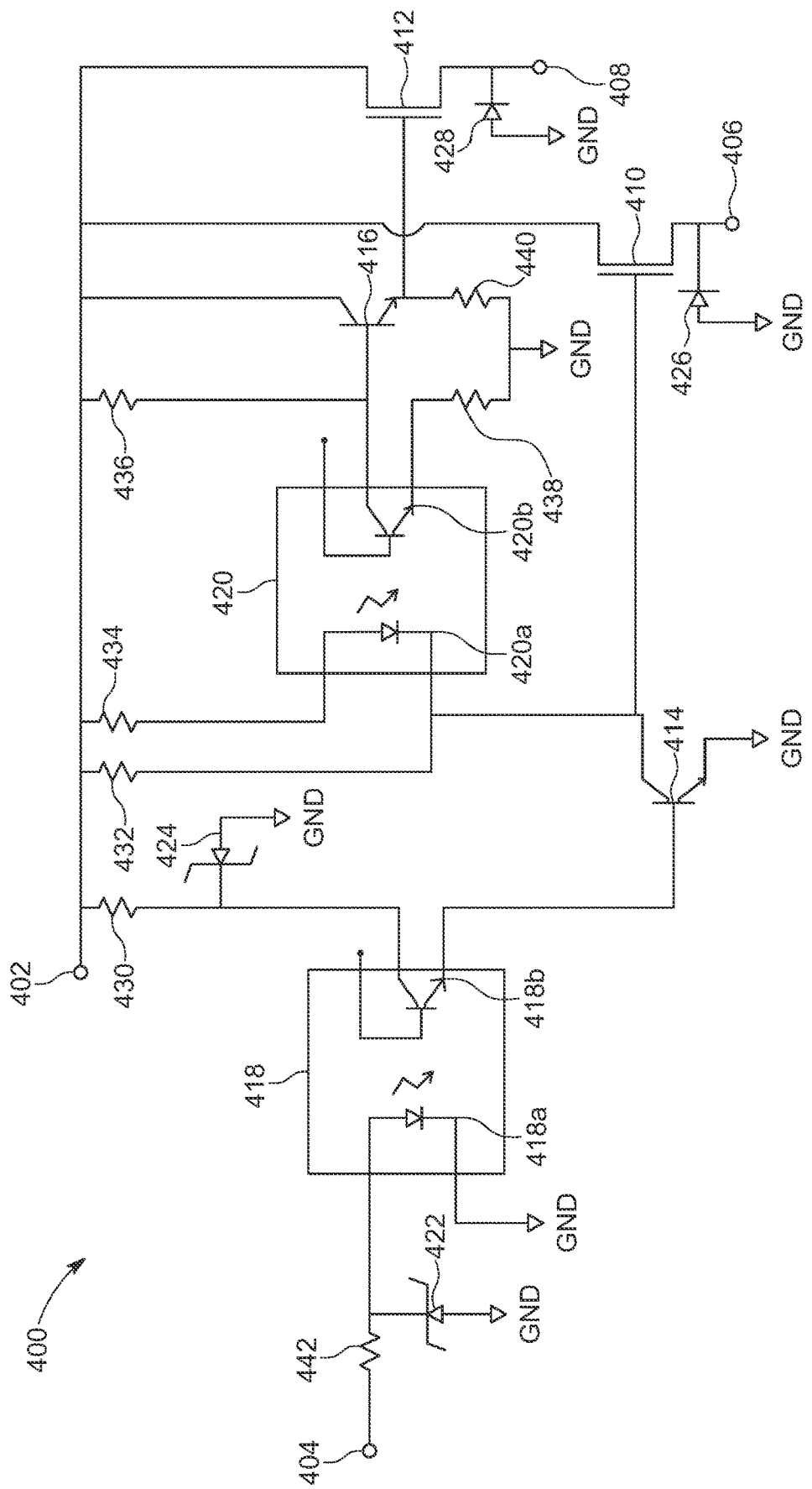
FIG. 4 shows a non-limiting example of a forward operating solid-state relay including an opto-isolated input signal, in accordance with some embodiments.

FIG. 4 shows a non-limiting example of a solid-state relay 400 including an opto-isolated input signal, in accordance with some embodiments. The solid-state relay 400 can function similar to a mechanical relay. However, the solid-state relay 400 includes solid-state devices and components, rather than mechanical moving components such as an armature. Furthermore, one of ordinary skill recognizes that the circuit diagram shown in FIG. 4 is only one example and various modifications can be made to achieve the same or similar functionality. Furthermore, although certain devices are shown, embodiments are not limited thereto, and various devices can be used. Furthermore, although a certain number of transistors are shown, embodiments are not limited thereto, and one or more transistors may be placed in parallel, series, or both to provide additional current density.

In some embodiments, the solid-state relay 400 can include 5 terminals including COM terminal 402, TRG terminal 404, NC terminal 406, NO terminal 408, and GND terminal (GND). Functionally, the COM terminal 404 can correspond to the COM terminal of the mechanical relay, the TRG terminal 404 can correspond to the TRG terminal of the mechanical relay, the NC terminal 406 can correspond to the NC terminal of the mechanical relay, the NO terminal 408 can correspond to the NO terminal of the mechanical relay, and the GND can correspond to the GND terminal of the mechanical relay. The solid-state relay 400 can operate in a forward direction in that an input signal can be provided at the COM terminal 402.

In some embodiments, the solid-state relay 400 includes a plurality of transistors including transistor 410, transistor 412, transistor 414, and transistor 416. In FIG. 4, each of the transistors 410 and 412 includes an n-channel metal-oxide-semiconductor field-effect transistor (MOSFET), and each of the transistors 414 and 416 includes an NPN bipolar junction transistor (BJT), but embodiments are not limited thereto. For example, one of ordinary skill can design the forward operating solid-state relay with p-channel MOSFETs and/or PNP BJTs, and/or only MOSFETs and/or only BJTs, and/or other types of transistors.

In some embodiments, the solid-state relay 400 can include an opto-coupler 418 and an opto-coupler 420. The opto-coupler 418 can include a light-emitting diode (LED) 418a and a photosensitive device 418b. The opto-coupler 420 can include an LED 420a and a photosensitive device 420b. An opto-coupler can be used to isolate two circuits from each other, e.g., a circuit connected to the LED can be separated from the circuit connected to the photosensitive device (e.g., a phototransistor). When a minimum voltage difference exists between the two terminals of the LED, the LED emits a light (e.g., infrared light) with an intensity that is proportional to the voltage difference. Then the light can be detected by the photosensitive device which turns on based at least in part on the intensity of the light from the LED, causing the photosensitive device to act as a conductor between the two terminals. Similarly, each of the opto-couplers 418 and 420 can be used to isolate circuits on either side of the respective opto-couplers 418 and 420.

In some embodiments, the solid-state relay 400 can include diodes 422, 424, 426, and 428. Each of the diodes 422 and 424 can include a Zener diode, although embodiments are not limited thereto, and can include other types of diodes. Each of the diodes 426 and 428 can include a normal diode (e.g., pn junction diode), although embodiments are not limited thereto, and can include other types of diodes. Each of the diodes 422-428 has its anode connected to GND. Accordingly, the diodes 422-428 can help prevent electrical spikes and helps prevent issues caused by polarity reversals.

In some embodiments, the solid-state relay 400 can include resistors 430, 432, 434, 436, 438, 440, and 442 that can function as termination resistors and/or voltage dividers. In some embodiments, the resistances of resistors 430, 432, 436, and 442 can be approximately the same or similar. The resistances of resistor 434 can be approximately twice that of the resistances of resistors 430, 432, 436, and 442. The resistances of resistors 438 and 440 can be greater than by three times, for example, the resistance of resistor 434 or by five or six times, for example, the resistances of resistors 430, 432, 436, and 442. Accordingly, the resistances of the resistors 430, 432, 434, 436, 438, 440, and 442 can help bias one or more terminals of the transistors.

An untriggered condition (or first mode) of the solid-state relay 400 is described. In some embodiments, in the untriggered condition, the TRG terminal 404 can have a low voltage. This can cause the opto-coupler 418 to turn off (or remain turned off), meaning the LED 418a is not turned on, and therefore the photosensitive device 418b does not detect any light, creating an open circuit between the COM terminal 402 and a base terminal of the transistor 414. The transistor 410 has a gate terminal connected to the COM terminal 402 via the resistor 432, which causes the gate terminal of the transistor 410 to rise, causing the transistor 410 to turn on and electrically connect the COM terminal 402 to the NC terminal 406.

Simultaneously or substantially simultaneously, the transistor 412 has a gate terminal that is connected to a node between an emitter terminal of the transistor 416 and the resistor 440. The transistor 416 has a base connected to the optocoupler 420 and the resistor 436, and the transistor 416 does not conduct emitter current (e.g., the transistor 416 is in a cutoff region) when the TRG terminal 404 has a low voltage. Accordingly, the transistor 412 is turned off, and the NO terminal 408 is not electrically connected to the COM terminal 402. Therefore, during the untriggered condition of the solid-state relay 400, the COM terminal 402 is connected to the NC terminal 406 and disconnected from the NO terminal 408.

In a triggered condition (or a second mode), when the trigger terminal 404 switches to having a high voltage (e.g., a voltage above a threshold voltage), a voltage difference occurs between the anode and cathode of the LED 418a such that the LED 418a turns on and emits light (e.g., infrared light). The photosensitive device 418b can detect the light emitted by the LED 418a and electrically connects the resistor 430 (and the COM terminal 402) to a base terminal of the transistor 414. As the voltage of the base terminal of the transistor 414 transitions higher, the transistor 414 can enter a forward-active mode, which pulls down the voltage of the collector terminal of the transistor 414. Then the transistor 410 turns off because the gate of the transistor 410 is low, below the threshold voltage. Accordingly, the COM terminal 402 can be electrically disconnected from the NC terminal 406.

Simultaneously, or substantially simultaneously, as the voltage of the collector terminal of the transistor 414 is pulled down, a bigger voltage difference occurs between the anode and cathode of the LED 420a in the optocoupler 420, (as there is a current path between the transistor 414 and GND) which turns on the LED 420a to emit light (e.g., infrared light). The photosensitive device 420b can detect the light from the LED 420a and electrically connect the resistor 436 (and the COM terminal 420) to the resistor 438. Because the resistor 438 has a resistance that is several times (e.g., 5 or 6 times, but not limited thereto) the resistance of the resistor 436, the base terminal of the transistor 416 can be biased to set the transistor 416 in a forward-active region. The emitter terminal of the transistor 416, which connects to the gate terminal of the transistor 412, is set high and turns on the transistor 412, which then electrically connects the COM terminal 402 to the NO terminal 408.

Accordingly, the solid-state relay 400 can operate similar to a mechanical relay. In some embodiments, the COM terminal 402 can be electrically connected to the NC terminal 406 when the TRG terminal 404 has a low voltage or turn-off voltage. In some embodiments, when the voltage of the TRG terminal 404 is set to a high voltage or a turn-on voltage, the COM terminal 402 can electrically disconnect from the NC terminal 406 and electrically connect to the NO terminal 408.

Figure 5:
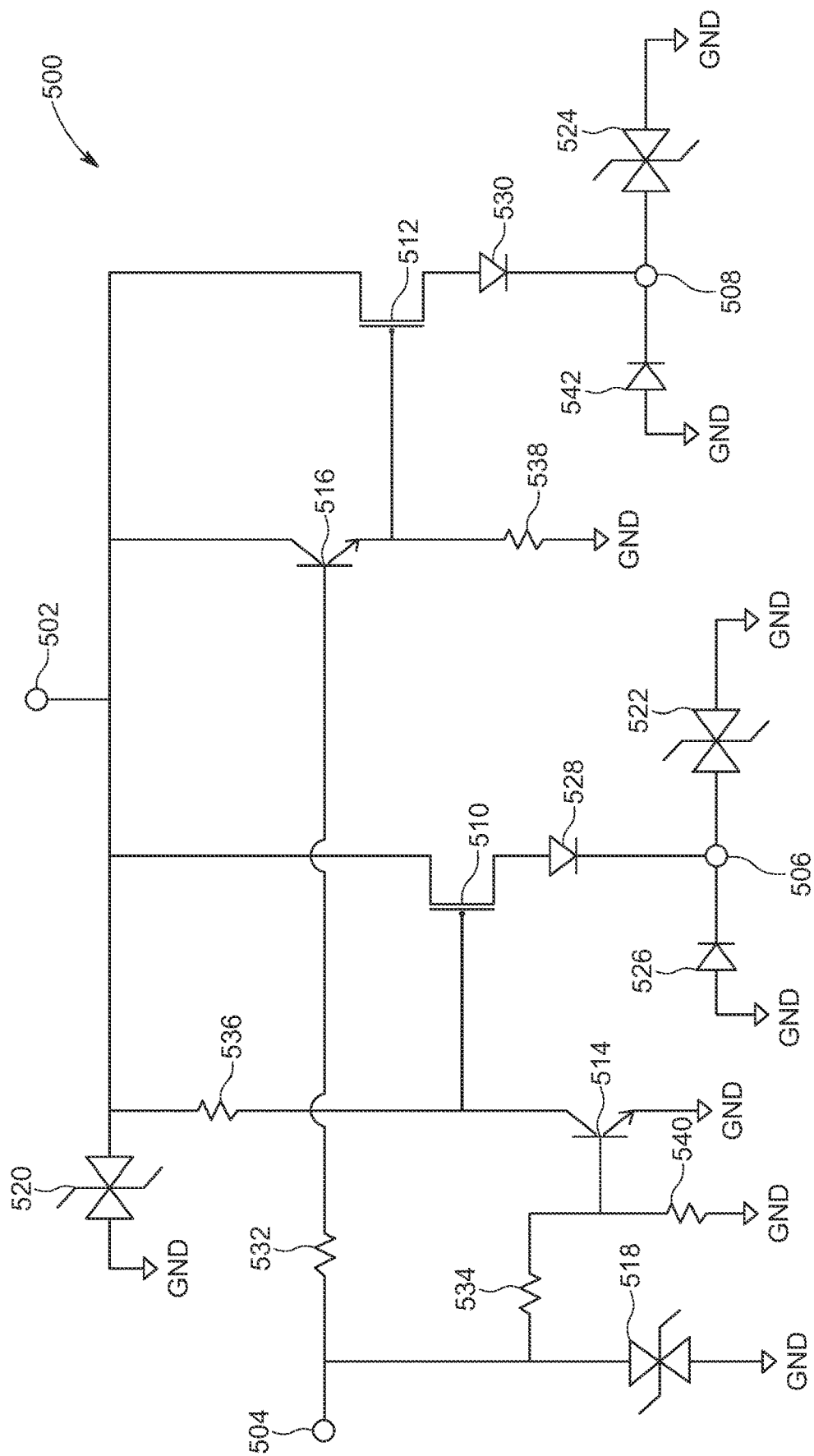
FIG. 5 shows a non-limiting example of another forward operating solid-state relay without an opto-isolated input signal, in accordance with some embodiments.

FIG. 5 shows a non-limiting example of another solid-state relay 500 without an opto-isolated input signal, in accordance with some embodiments. The solid-state relay 500 can be similar to the solid-state relay 400 of FIG. 4, except that the solid-state relay 500 does not have optocouplers that isolate the input circuit from the output circuit. Instead, the solid-state relay 500 uses transistors. Furthermore, one of ordinary skill recognizes that the circuit diagram shown in FIG. 5 is only one example and various modifications can be made to achieve the same or similar functionality. Furthermore, although certain devices are shown, embodiments are not limited thereto, and various devices can be used.

In some embodiments, the solid-state relay 500 can include 5 terminals including COM terminal 502, TRG terminal 504, NC terminal 506, NO terminal 508, and GND terminal (GND) Functionally, the COM terminal 504 can correspond to the COM terminal of the mechanical relay, the TRG terminal 504 can correspond to the TRG terminal of the mechanical relay, the NC terminal 506 can correspond to the NC terminal of the mechanical relay, the NO terminal 508 can correspond to the NO terminal of the mechanical relay, and the GND can correspond to the GND terminal of the mechanical relay. The solid-state relay 500 can operate in a forward direction in that an input signal can be provided at the COM terminal 502.

In some embodiments, the solid-state relay 500 includes a plurality of transistors including transistor 510, transistor 512, transistor 514, and transistor 516. In FIG. 5, each of the transistors 510 and 512 includes an n-channel MOSFET, and each of the transistors 514 and 516 includes an NPN BJT, but embodiments are not limited thereto. For example, one of ordinary skill can design the forward operating solid-state relay with p-channel MOSFETs and/or PNP BJTs, and/or only MOSFETs and/or only BJTs, and/or other types of transistors.

In some embodiments, the solid-state relay 500 can include diodes 518, 520, 522, 524, 526, 528, 530, and 542. Each of the diodes 518, 520, 522, and 524 can include a transient-voltage-suppression (TVS) diode which can protect the circuit from voltage spikes induced on connected wires. For example, each of the diodes 518, 520, 522, and 524 has a terminal connected to GND. Also, each of the diodes 526, 528, 530, and 542 can include normal diode (e.g., pn junction diode), although embodiments are not limited thereto, and can include other types of diodes. Each of the diodes 526 and 542 has its anode connected to GND. The diode 528 has an anode connected to the transistor 510, and a cathode connected to NC terminal 506 to help current flow in one direction. Similarly, the diode 530 has an anode connected to the transistor 512 and a cathode connected to the NO terminal 508 to help current flow in one direction.

In some embodiments, the solid-state relay 500 can include resistors 532, 534, 536, 538, and 540 that can function as termination resistors and/or voltage dividers. In some embodiments, the resistances of resistors 532 and 534 can be approximately the same or similar. The resistances of resistors 536, 538, and 540 can be approximately the same or similar. The resistances of the 536, 538, and 540 can be greater than the resistances of the resistors 532 and 534 by, for example, five or six times, although embodiments are not limited thereto. Accordingly, the resistors 532, 534, 536, 538, and 540 can help bias one or more terminals of the transistors.

An untriggered condition (or first mode) of the solid-state relay 500 is described. In some embodiments, in the untriggered condition, the TRG terminal 504 can have a low voltage which can cause the transistor 514 (via resistor 534) to turn off (e.g., enter cutoff region). The low voltage of the TRG terminal 504 can also cause the transistor 516 (via resistor 532) to turn off, which can cause a node connected between the emitter terminal of the transistor 516 and the resistor 538 to be pulled to a low voltage (e.g., GND) such that the transistor 512 is turned off. Accordingly, the NO terminal 508 can be electrically disconnected from the COM terminal 502.

Simultaneously or substantially simultaneously, a low voltage on the COM terminal 502 can cause the transistor 510 to turn on because the voltage of a gate terminal of the transistor 510 can be pulled up via the resistor 536. The COM terminal 502 can be connected to the NC terminal 506 via the diode 528. Therefore, during the untriggered condition of the solid-state relay 500, the COM terminal can be electrically connected to the NC terminal 506 and electrically disconnected from the NO terminal 508.

In a triggered condition (or a second mode), when the TRG terminal 504 switches to having a high voltage (e.g., a voltage above a threshold voltage), the base terminal of the transistor 514 can be raised higher to put the transistor 514 in a forward-active region to conduct a current between the collector terminal and the emitter terminal of the transistor 514. This can cause the transistor 510 to turn off because the gate terminal of the transistor 510 can be pulled down, which causes the COM terminal 502 to be electrically disconnected from the NC terminal 506.

Simultaneously, or substantially simultaneously, as the TRG terminal 504 has a high voltage, the base terminal of the transistor 516 is also raised, causing the transistor 516 to enter into a forward-active region. This can cause a node between the emitter terminal of the transistor 516 and the resistor 538 to be pulled up towards the COM terminal 502, which can raise the voltage on the gate terminal of the transistor 512. This can cause the transistor 512 to turn on and conduct current between the COM terminal 502 to the NO terminal 508 via the diode 530.

Accordingly, the solid-state relay 500 can operate similarly to a mechanical relay. In some embodiments, the COM terminal 502 can be electrically connected to the NC terminal 506 when the TRG terminal 504 has a low voltage or turn-off voltage. In some embodiments, when the voltage of the TRG terminal 504 is set to a high voltage or a turn-on voltage, the COM terminal 502 can electrically disconnect from the NC terminal 506 and electrically connect to the NO terminal 508.

Figure 6:
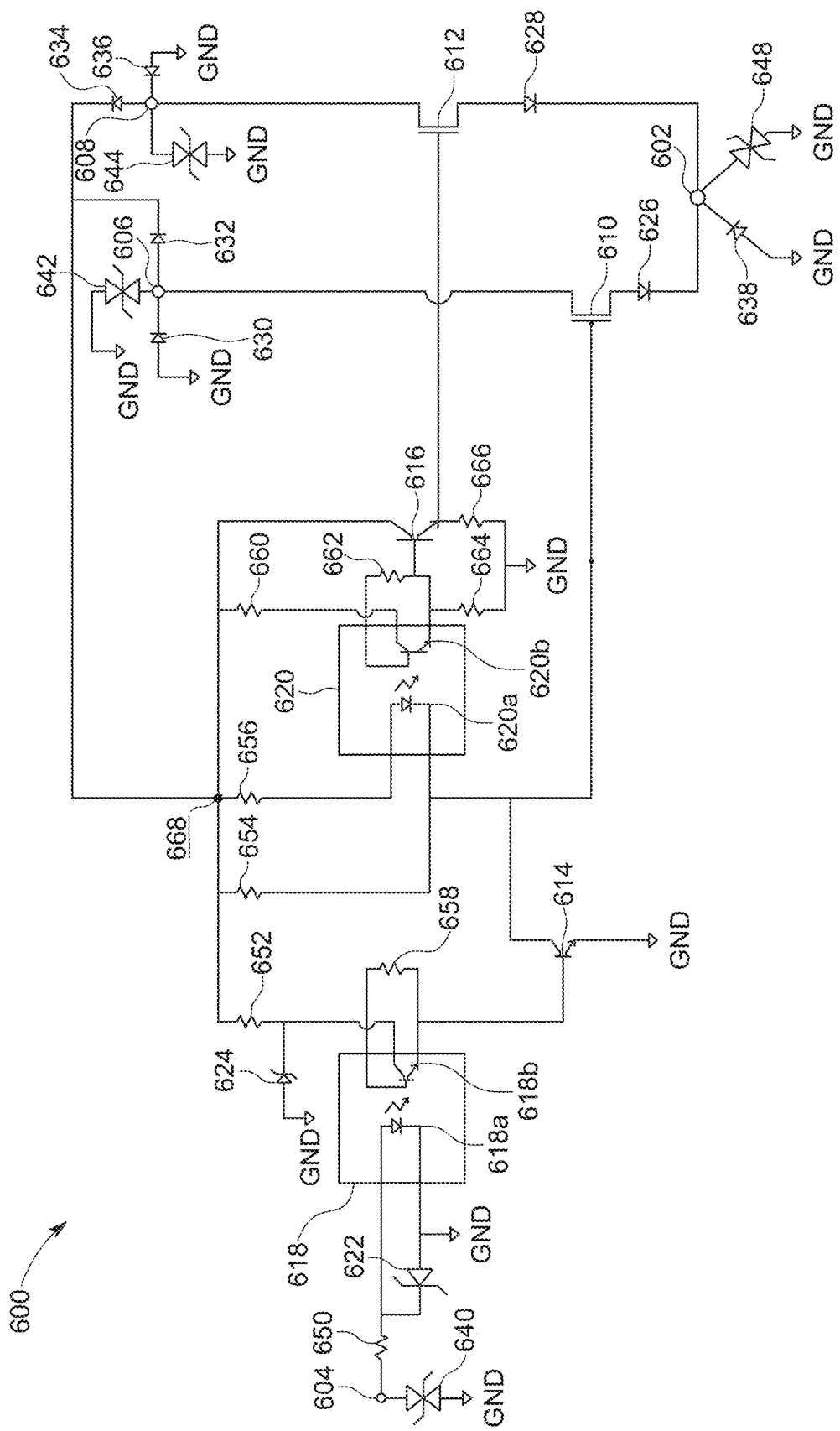
FIG. 6 shows a non-limiting example of a backward operating solid-state relay including an opto-isolated input signal, in accordance with some embodiments.

FIG. 6 shows a non-limiting example of a solid-state relay 600 including an opto-isolated input signal, in accordance with some embodiments. The solid-state relay 600 can function similar to a mechanical relay. However, the solid-state relay 600 includes solid-state devices and components, rather than mechanical moving components such as an armature. Furthermore, one of ordinary skill recognizes that the circuit diagram shown in FIG. 6 is only one example and various modifications can be made to achieve the same or similar functionality. Furthermore, although certain devices are shown, embodiments are not limited thereto, and various devices can be used.

In some embodiments, the solid-state relay 600 can include 5 terminals including COM terminal 602, TRG terminal 604, NC terminal 606, NO terminal 608, and GND terminal (GND). Functionally, the COM terminal 604 can correspond to the COM terminal of the mechanical relay, the TRG terminal 604 can correspond to the TRG terminal of the mechanical relay, the NC terminal 606 can correspond to the NC terminal of the mechanical relay, the NO terminal 608 can correspond to the NO terminal of the mechanical relay, and the GND can correspond to the GND terminal of the mechanical relay. The solid-state relay 600 can operate in a backward direction in that an input signal can be provided at the NC terminal 606 and/or NO terminal 608. For example, the NC terminal 606 and/or the NO terminal 608 can have a higher voltage than the COM terminal 602.

In some embodiments, the solid-state relay 600 includes a plurality of transistors including transistor 610, transistor 612, transistor 614, and transistor 616. In FIG. 6, each of the transistors 610 and 612 includes an n-channel MOSFET, and each of the transistors 614 and 616 includes an NPN BJT, but embodiments are not limited thereto. For example, one of ordinary skill can design the forward operating solid-state relay with p-channel MOSFETs and/or PNP BJTs, and/or only MOSFETs and/or only BJTs, and/or other types of transistors.

In some embodiments, the solid-state relay 600 can include an opto-coupler 618 and an opto-coupler 620. The opto-coupler 618 can include an LED 618a and a photosensitive device 618b. The opto-coupler 620 can include an LED 620a and a photosensitive device 620b. An opto-coupler can be used to isolate two circuits from each other, e.g., a circuit connected to the LED can be separated from the circuit connected to the photosensitive device (e.g., a phototransistor). When a minimum voltage difference exists between the two terminals of the LED, the LED emits a light (e.g., infrared light) with an intensity that is proportional to the voltage difference. Then the light can be detected by the photosensitive device which turns on based at least in part on the intensity of the light from the LED, causing the photosensitive device to act as a conductor between the two terminals. Similarly, each of the opto-couplers 618 and 620 can be used to isolate circuits on either side of the respective opto-couplers 618 and 620.

In some embodiments, the solid-state relay 600 can include diodes 622, 624, 626, 628, 630, 632, 634, 636, 638, 640, 642, 644, and 648. Each of the diodes 622 and 624 can include a Zener diode, although embodiments are not limited thereto, and can include other types of diodes. Each of the diodes 626, 628, 630, 632, 634, 636, and 638 can include a normal diode (e.g., pn junction diode), although embodiments are not limited thereto, and can include other types of diodes. Each of the diodes 640, 642, 644, and 648 can include a TVS diode, although embodiments are not limited thereto, and can include other types of diodes. Each of the diodes 622, 624, 630, 636, 638, 640, 642, 644, and 648 can include a terminal connected to GND. The diode 626 can be connected between the transistor 610 and the COM terminal 602, the diode 628 can be connected between the transistor 612 and the COM terminal 602, the diode 632 can be connected between the NC terminal 606 and the transistor 616 and resistors, and the diode 634 can be connected between the NO terminal 608 and the transistors and resistors. Depending on its connection, the diodes can provide protection from transient voltage spikes (e.g., TVS diodes) or help current flow in a certain direction (e.g., Zener diodes and/or pn junction diodes).

In some embodiments, the solid-state relay 600 can include resistors 650, 652, 654, 656, 658, 660, 662, 664, and 666, that can function as termination resistors and/or voltage dividers. In some embodiments, the resistances of resistors 650, 652, 654, and 660 can be approximately the same or similar. The resistance of resistor 656 can be approximately twice that of the resistors 650, 652, 654, and 660. The resistances of resistors 658 and 662 can be approximately the same or similar. The resistances of the 658 and 662 can be a magnitude or two magnitudes greater than the resistors 658 and 662. Accordingly, the resistances of the resistors 650-666 can help bias one or more terminals of the transistors.

An untriggered condition (or first mode) of the solid-state relay 600 is described. In some embodiments, in the untriggered condition, the TRG terminal 604 can have a low voltage. This can cause the opto-coupler 618 to turn off (or remain turned off), meaning the LED 618a is not turned on, and therefore the photosensitive device 618b does not detect any light. This can cause the a gate terminal of the transistor 610 to be raised to a voltage level of a common node 668. The common node 668's voltage level is a maximum of the voltage at the NC terminal 606 and NO terminal 608 (minus a voltage drop from diode 632 or 634) Further, when TRG terminal 604 has a low voltage, there is no current path for the LED 620a to GND, meaning transistor 616 is off, and the transistor 612 is also off.

Simultaneously or substantially simultaneously, the transistor 612 has a gate terminal that is connected to a node between an emitter terminal of the transistor 616 and the resistor 666. The transistor 616 has a base terminal connected to the optocoupler 620 and the resistors 664 and 666, and the transistor 616 does not conduct emitter current (e.g., the transistor 616 is in a cutoff region) when the TRG terminal 604 has a low voltage. Accordingly, the transistor 612 is turned off, and the NO terminal 608 is not electrically connected to the COM terminal 602. Therefore, during the untriggered condition of the solid-state relay 600, the COM terminal 602 is connected to the NC terminal 606 and disconnected from the NO terminal 608.

In a triggered condition (or a second mode), when the trigger terminal 604 switches to having a high voltage (e.g., a voltage above a threshold voltage), a voltage difference occurs between the anode and cathode of the LED 618a such that the LED 618a turns on and emits light (e.g., infrared light). The photosensitive device 618b can detect the light emitted by the LED 618a and electrically connects the resistor 652 to a base terminal of the transistor 614. As the voltage of the base terminal of the transistor 614 transitions higher (due to a high voltage from the NC terminal 606 and/or NO terminal 608, the transistor 614 can enter a forward-active mode, which pulls down the voltage of the collector terminal of the transistor 614. Then the transistor 610 turns off because the gate terminal of the transistor 610 is low, below the threshold voltage. Accordingly, the COM terminal 602 can be electrically disconnected from the NC terminal 606.

Simultaneously, or substantially simultaneously, as the voltage of the collector terminal of the transistor 614 is pulled down, a bigger voltage difference occurs between the anode and cathode of the LED 620a in the optocoupler 620, which turns on the LED 620a to emit light (e.g., infrared light). The photosensitive device 620b can detect the light from the LED 620a and electrically connect the resistor 660 to the resistor 664. Because the resistor 664 has a resistance that is several times (e.g., 5 or 6 times, but not limited thereto) the resistance of the resistor 660, the base terminal of the transistor 616 can be biased to set the transistor 616 in a forward-active region. The emitter terminal of the transistor 616, which connects to the gate terminal of the transistor 612, is set high and turns on the transistor 612, which then electrically connects the COM terminal 602 to the NO terminal 608. The diode 628 can help ensure that the current flows in a certain direction.

Accordingly, the solid-state relay 600 can operate similar to a mechanical relay. In some embodiments, the COM terminal 602 can be electrically connected to the NC terminal 606 when the TRG terminal 604 has a low voltage or turn-off voltage. In some embodiments, when the voltage of the TRG terminal 604 is set to a high voltage or a turn-on voltage, the COM terminal 602 can electrically disconnect from the NC terminal 606 and electrically connect to the NO terminal 608. However, unlike the solid-state relay 400 of FIG. 4 where the input signal can be provided to the COM terminal 402, the solid-state relay 600 can operate in a backward mode such that the input signal can be provided to the NC terminal 606 and/or the NO terminal 608.

Figure 7:
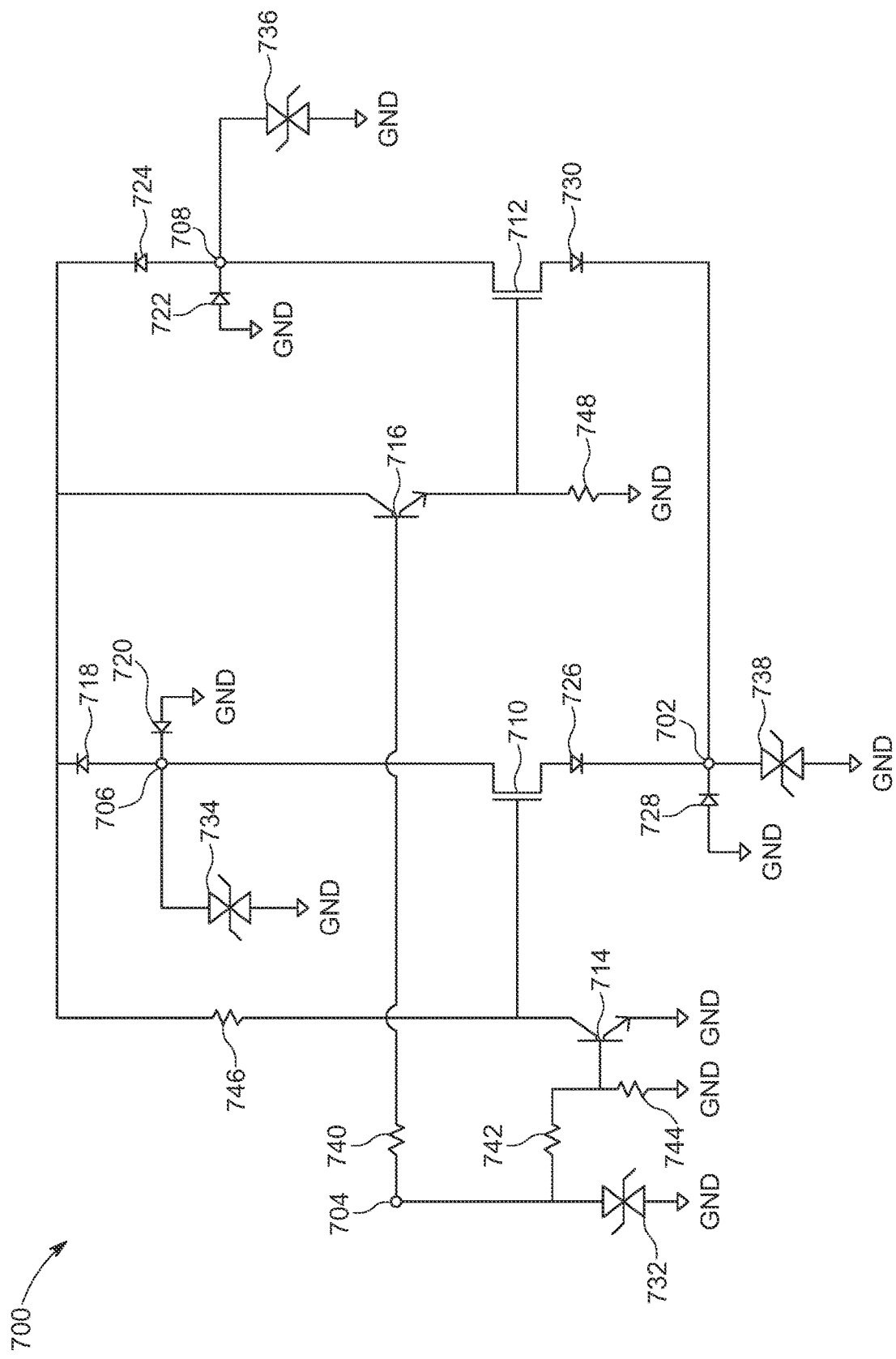
FIG. 7 shows a non-limiting example of a backward operating solid-state relay without an opto-isolated input signal, in accordance with some embodiments.

FIG. 7 shows a non-limiting example of a solid-state relay 700 without an opto-isolated input signal, in accordance with some embodiments. The solid-state relay 700 can be similar to the solid-state relay 600 of FIG. 6, except that the solid-state relay 700 does not have optocouplers that isolate the input circuit from the output circuit. Instead, the solid-state relay 700 uses transistors. Furthermore, one of ordinary skill recognizes that the circuit diagram shown in FIG. 7 is only one example and various modifications can be made to achieve the same or similar functionality. Furthermore, although certain devices are shown, embodiments are not limited thereto, and various devices can be used.

In some embodiments, the solid-state relay 700 can include 5 terminals including COM terminal 702, TRG terminal 704, NC terminal 706, NO terminal 708, and GND terminal (GND) Functionally, the COM terminal 704 can correspond to the COM terminal of the mechanical relay, the TRG terminal 704 can correspond to the TRG terminal of the mechanical relay, the NC terminal 706 can correspond to the NC terminal of the mechanical relay, the NO terminal 708 can correspond to the NO terminal of the mechanical relay, and the GND can correspond to the GND terminal of the mechanical relay. The solid-state relay 700 can operate in a backward direction in that an input signal can be provided at the NC terminal 706 and/or NO terminal 708. For example, the NC terminal 706 and/or the NO terminal 708 can have a higher voltage than the COM terminal 702.

In some embodiments, the solid-state relay 700 includes a plurality of transistors including transistor 710, transistor 712, transistor 714, and transistor 716. In FIG. 7, each of the transistors 710 and 712 includes an n-channel MOSFET, and each of the transistors 714 and 716 includes an NPN BJT, but embodiments are not limited thereto. For example, one of ordinary skill can design the forward operating solid-state relay with p-channel MOSFETs and/or PNP BJTs, and/or only MOSFETs and/or only BJTs, and/or other types of transistors.

In some embodiments, the solid-state relay 700 can include diodes 720, 722, 724, 726, 728, 730, 732, 734, 736, and 738. Each of the diodes 720, 722, 724, 726, 728, and 730 can include a normal diode (e.g., pn junction diode), although embodiments are not limited thereto, and can include other types of diodes. Each of the diodes 732, 734, 736, and 738 can include a TVS diode, although embodiments are not limited thereto, and can include other types of diodes. Each of the diodes 720, 722, 728, 732, 734, 736, and 738 can include a terminal connected to GND. The diode 724 can be connected between the NO terminal 708 and the transistor 716, transistor 714 and diode 718. The diode 726 can be connected between the transistor 710 and the COM terminal 702. The diode 730 can be connected between transistor 712 and the COM terminal 702. Depending on its connection, the diodes can provide protection from transient voltage spikes (e.g., TVS diodes) or help current flow in a certain direction (e.g., pn junction diodes).

In some embodiments, the solid-state relay 700 can include resistors 740, 742, 744, 746, and 748 that can function as termination resistors and/or voltage dividers. In some embodiments, the resistances of resistors 740 and 742 can be approximately the same or similar, and the resistances of resistors 744, 746, and 748 can be approximately the same or similar. The resistance of resistors 744, 746, and 748 can be approximately five or six times greater than that of the resistors 740 and 742, but embodiments are not limited thereto. Accordingly, the resistances of the resistors 740-748 can help bias one or more terminals of the transistors.

An untriggered condition (or first mode) of the solid-state relay 700 is described. In some embodiments, in the untriggered condition, the TRG terminal 704 can have a low voltage which can cause the transistor 714 (via resistor 742) to turn off (e.g., enter cutoff region). The low voltage of the TRG terminal 704 can also cause the transistor 716 (via resistor 740) to turn off, which can cause a node connected between the emitter terminal of the transistor 716 and the resistor 748 to be pulled to a low voltage such that the transistor 712 is turned off. Accordingly, the NO terminal 708 can be electrically disconnected from the COM terminal 702.

Simultaneously or substantially simultaneously, a low voltage on the NC terminal 706 can cause the transistor 710 to turn on because the voltage of a gate terminal of the transistor 710 can be pulled up via the resistor 746. The COM terminal 702 can be electrically connected to the NC terminal 706 via the diode 726. Therefore, during the untriggered condition of the solid-state relay 700, the COM terminal 702 can be electrically connected to the NC terminal 706 and electrically disconnected from the NO terminal 708.

In a triggered condition (or a second mode), when the TRG terminal 704 switches to having a high voltage (e.g., a voltage above a threshold voltage), the base terminal of the transistor 714 can be raised higher to put the transistor 714 in a forward-active region to conduct a current between the collector terminal and the emitter terminal of the transistor 714. This can cause the transistor 710 to turn off because the gate terminal of the transistor 710 can be pulled down, which causes the COM terminal 702 to be electrically disconnected from the NC terminal 706.

Simultaneously, or substantially simultaneously, as the TRG terminal 704 has a high voltage, the base terminal of the transistor 716 is also raised, causing the transistor 716 to enter into a forward-active region. This can cause a node between the emitter terminal of the transistor 716 and the resistor 748 to be pulled up towards the NC terminal 706 and/or NO terminal 708, which can raise the voltage on the gate terminal of the transistor 712. This can cause the transistor 712 to turn on and conduct current between the COM terminal 702 to the NO terminal 708 via the diode 730.

Accordingly, the solid-state relay 700 can operate similarly to a mechanical relay. In some embodiments, the COM terminal 702 can be electrically connected to the NC terminal 706 when the TRG terminal 704 has a low voltage or turn-off voltage. In some embodiments, when the voltage of the TRG terminal 704 is set to a high voltage or a turn-on voltage, the COM terminal 702 can electrically disconnect from the NC terminal 706 and electrically connect to the NO terminal 708. And unlike the solid-state relay 600 of FIG. 6, the solid-state relay 700 does not include opto-couplers. Accordingly, the solid-state relay 700 can operate in a backward operation (e.g., the input signals are received via the NC terminal 706 and/or the NO terminal 708).

Figure 8:
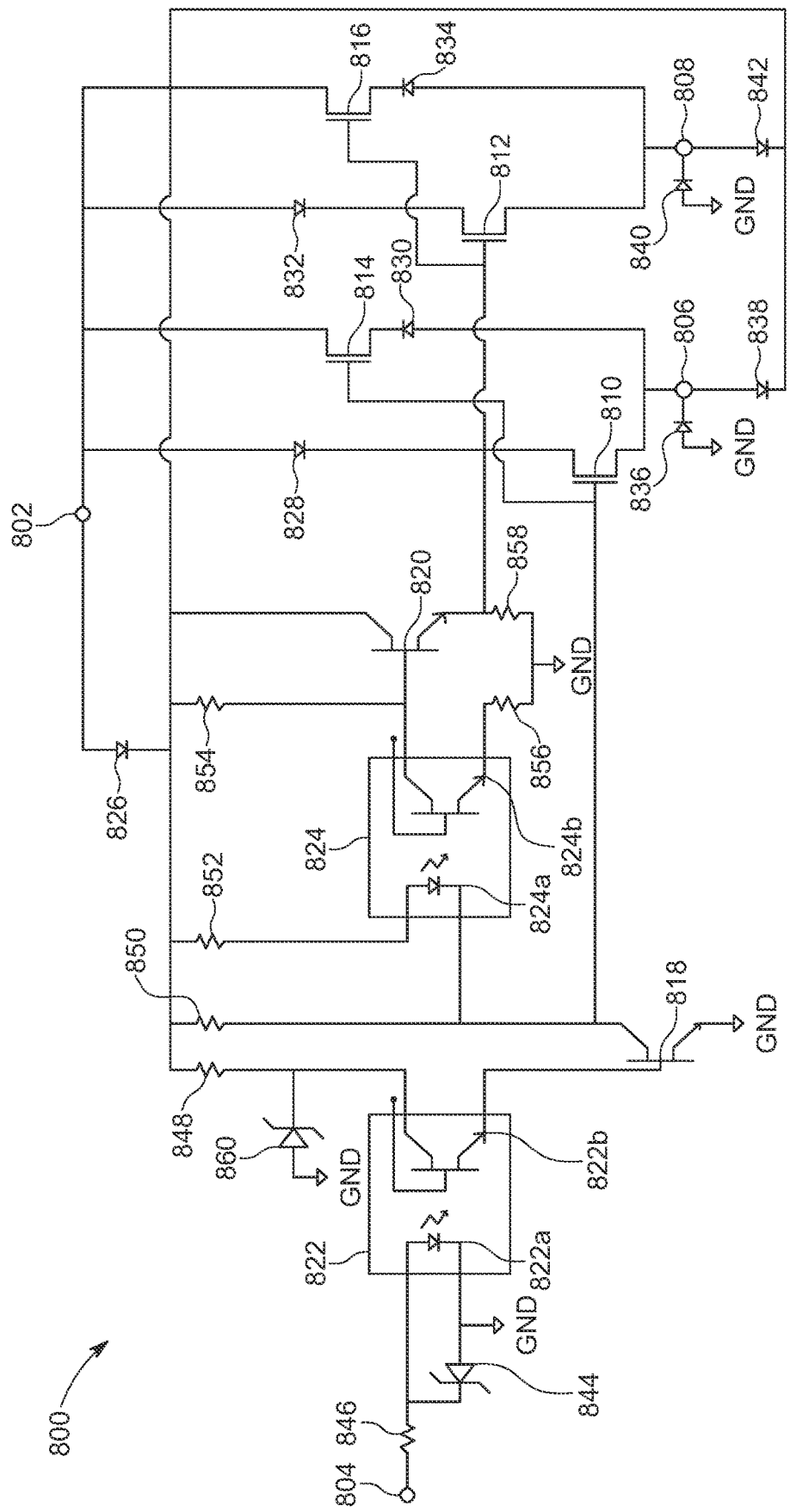
FIG. 8 shows a non-limiting example of a bidirectional solid-state relay, in accordance with some embodiments.

FIG. 8 shows a non-limiting example of a bidirectional solid-state relay 800, in accordance with some embodiments. In some embodiments, the bidirectional solid-state relay 800 can have the input signal be provided from the COM terminal and/or the NC/NO terminals. In other words, the COM terminal can have a higher voltage or the NC/NO terminals can have a higher voltage. The solid-state relay 800 can function similar to a mechanical relay. However, the solid-state relay 800 includes solid-state devices and components, rather than mechanical moving components such as an armature. Furthermore, one of ordinary skill recognizes that the circuit diagram shown in FIG. 8 is only one example and various modifications can be made to achieve the same or similar functionality. Furthermore, although certain devices are shown, embodiments are not limited thereto, and various devices can be used.

In some embodiments, the solid-state relay 800 can include 5 terminals including COM terminal 802, TRG terminal 804, NC terminal 806, NO terminal 808, and GND terminal (GND). Functionally, the COM terminal 804 can correspond to the COM terminal of the mechanical relay, the TRG terminal 804 can correspond to the TRG terminal of the mechanical relay, the NC terminal 806 can correspond to the NC terminal of the mechanical relay, the NO terminal 808 can correspond to the NO terminal of the mechanical relay, and the GND can correspond to the GND terminal of the mechanical relay. The solid-state relay 800 can operate in a forward or a backward direction in that an input signal can be provided at the COM terminal 802 in a forward direction and the input signals can be provided at the NC terminal 806 and/or the NO terminal 808.

In some embodiments, the solid-state relay 800 includes a plurality of transistors including transistors 810, 812, 814, 816, 818, and 820. In FIG. 8, each of the transistors 810-816 includes an n-channel MOSFET, and each of the transistors 818 and 820 includes an NPN BJT, but embodiments are not limited thereto. For example, one of ordinary skill can design the forward operating solid-state relay with p-channel MOSFETs and/or PNP BJTs, and/or only MOSFETs and/or only BJTs, and/or other types of transistors.

In some embodiments, the solid-state relay 800 can include an opto-coupler 822 and an opto-coupler 824. The opto-coupler 822 can include an LED 822a and a photosensitive device 822b. The opto-coupler 824 can include an LED 824a and a photosensitive device 824b. An opto-coupler can be used to isolate two circuits from each other, e.g., a circuit connected to the LED can be separated from the circuit connected to the photosensitive device (e.g., a phototransistor). When a minimum voltage difference exists between the two terminals of the LED, the LED emits a light (e.g., infrared light) with an intensity that is proportional to the voltage difference. Then the light can be detected by the photosensitive device which turns on based at least in part on the intensity of the light from the LED, causing the photosensitive device to act as a conductor between the two terminals. Similarly, each of the opto-couplers 822 and 824 can be used to isolate circuits on either side of the respective opto-couplers 822 and 824.

In some embodiments, the solid-state relay 800 can include diodes 826, 828, 830, 832, 834, 836, 838, 840, 842, 844, and 860. Each of diodes 844 and 860 can include a Zener diode, although embodiments are not limited thereto, and can include other types of diodes. Each of the diodes 826, 828, 830, 832, 834, 836, 838, 840, and 842 can include a normal diode (e.g., pn junction diode), although embodiments are not limited thereto, and can include other types of diodes. Each of the diodes 836 and 840 has its anode connected to GND. The diodes 826, 828, 830, 832, 834, 838, and 842 can help the current flow in a certain direction.

In some embodiments, the solid-state relay 800 can include resistors 846, 848, 850, 852, 854, 856, and 858 that can function as termination resistors and/or voltage dividers. In some embodiments, the resistances of resistors 846, 848, 850, and 854 can be approximately the same or similar. The resistances of resistor 852 can be approximately twice that of the resistances of resistors 846, 848, 850, and 854. The resistances of resistors 856 and 858 can be greater than (by three times, for example) the resistance of resistor 852 or five or six times greater than the resistances of the resistors 846, 848, 850, and 854. Accordingly, the resistances of the resistors 846, 848, 850, 852, 854, 856, and 858 can help bias one or more terminals of the transistors.

An untriggered condition (or first mode) of the solid-state relay 800 is described. In some embodiments, in the untriggered condition, the TRG terminal 804 can have a low voltage. This can cause the opto-coupler 822 to turn off (or remain turned off), meaning the LED 822a is not turned on, and therefore the photosensitive device 822b does not detect any light, creating an open circuit between the COM terminal 802 and a base terminal of the transistor 818. The transistor 810 has a gate terminal connected to the COM terminal 802 via the resistor 850 and diode 826 which causes the gate terminal of the transistor 810 to rise, causing the transistor 810 to turn on and electrically connect the COM terminal 802 to the NC terminal 806.

Simultaneously or substantially simultaneously, the transistor 812 has a gate terminal that is connected to a node between an emitter terminal of the transistor 820 and the resistor 858. The transistor 820 has a base connected to the optocoupler 824 and the resistor 854, and the transistor 820 does not conduct emitter current (e.g., the transistor 820 is in a cutoff region) when the TRG terminal 804 has a low voltage. Accordingly, the transistor 812 is turned off, and the NO terminal 808 is not electrically connected to the COM terminal 802. Therefore, during the untriggered condition of the solid-state relay 800, the COM terminal 802 is connected to the NC terminal 806 and disconnected from the NO terminal 808.

The solid-state relay 800 can operate in a forward or backward mode while the solid-state relay 800 is in an untriggered state. For example, in a forward operation (e.g., COM terminal 802 is providing input signals), the COM terminal 802 has a higher voltage than the NC terminal 806 and the NO terminal 808. The COM terminal 802 can be connected to the NC terminal 806 via the transistor 810. The diode 828 ensures that current can flow from the COM terminal 802 to the NC terminal 806 when the COM terminal 802 has a higher voltage. On the other hand, in a backward mode, the NC terminal 806 can have a higher voltage than the COM terminal 802. In such situation, the transistor 814, which has a gate connected to the gate of the transistor 810, can turn on and allow a current to flow from the NC terminal 806 to the COM terminal 802 via the diode 830, which helps set the direction of current.

In a triggered condition (or a second mode), when the trigger terminal 804 switches to having a high voltage (e.g., a voltage above a threshold voltage), a voltage difference occurs between the anode and cathode of the LED 822a such that the LED 822a turns on and emits light (e.g., infrared light). The photosensitive device 822b can detect the light emitted by the LED 822a and electrically connects the resistor 848 (and the COM terminal 802 via the diode 826) to a base terminal of the transistor 818. As the voltage of the base terminal of the transistor 818 transitions higher, the transistor 818 can enter a forward-active mode, which pulls down the voltage of the collector terminal of the transistor 818. Then the transistor 810 (and transistor 814) turns off because the gate terminals of the transistors 810 and 814 are low, below the threshold voltage. Accordingly, the COM terminal 802 can be electrically disconnected from the NC terminal 806.

Simultaneously, or substantially simultaneously, as the voltage of the collector terminal of the transistor 818 is pulled down, a bigger voltage difference occurs between the anode and cathode of the LED 824a in the optocoupler 824, which turns on the LED 824a to emit light (e.g., infrared light). The photosensitive device 824b can detect the light from the LED 824a and electrically connect the resistor 854 (and the COM terminal 802 via the diode 826) to the resistor 856. Because the resistor 856 has a resistance that is several times (e.g., 5 or 6 times, but not limited thereto) the resistance of the resistor 854, the base terminal of the transistor 820 can be biased to set the transistor 820 in a forward-active region. The emitter terminal of the transistor 820, which connects to the gate terminal of the transistor 812, is set high and turns on the transistor 812, which then electrically connects the COM terminal 802 to the NO terminal 808.

The solid-state relay 800 can operate in a forward or backward mode while the solid-state relay 800 is in triggered state. For example, in a forward operation (e.g., COM terminal 802 is providing input signals), the COM terminal 802 has a higher voltage than the NC terminal 806 and the NO terminal 808. The COM terminal 802 can be connected to the NO terminal 808 via the transistor 812. The diode 832 ensures that current can flow from the COM terminal 802 to the NO terminal 808 when the COM terminal 802 has a higher voltage. On the other hand, in a backward mode, the NO terminal 808 can have a higher voltage than the COM terminal 802. In such situation, the transistor 816, which has a gate connected to the gate of the transistor 812, can turn on and allow a current to flow from the NO terminal 808 to the COM terminal 802 via the diode 834, which helps set the direction of current.

Accordingly, the solid-state relay 800 can operate in bidirectionally, in both a forward direction and a backward direction. In some embodiments, the COM terminal 802 can be electrically connected to the NC terminal 806 when the TRG terminal 804 has a low voltage or turn-off voltage. In some embodiments, when the voltage of the TRG terminal 804 is set to a high voltage or a turn-on voltage, the COM terminal 802 can electrically disconnect from the NC terminal 806 and electrically connect to the NO terminal 808.

Figure 9:
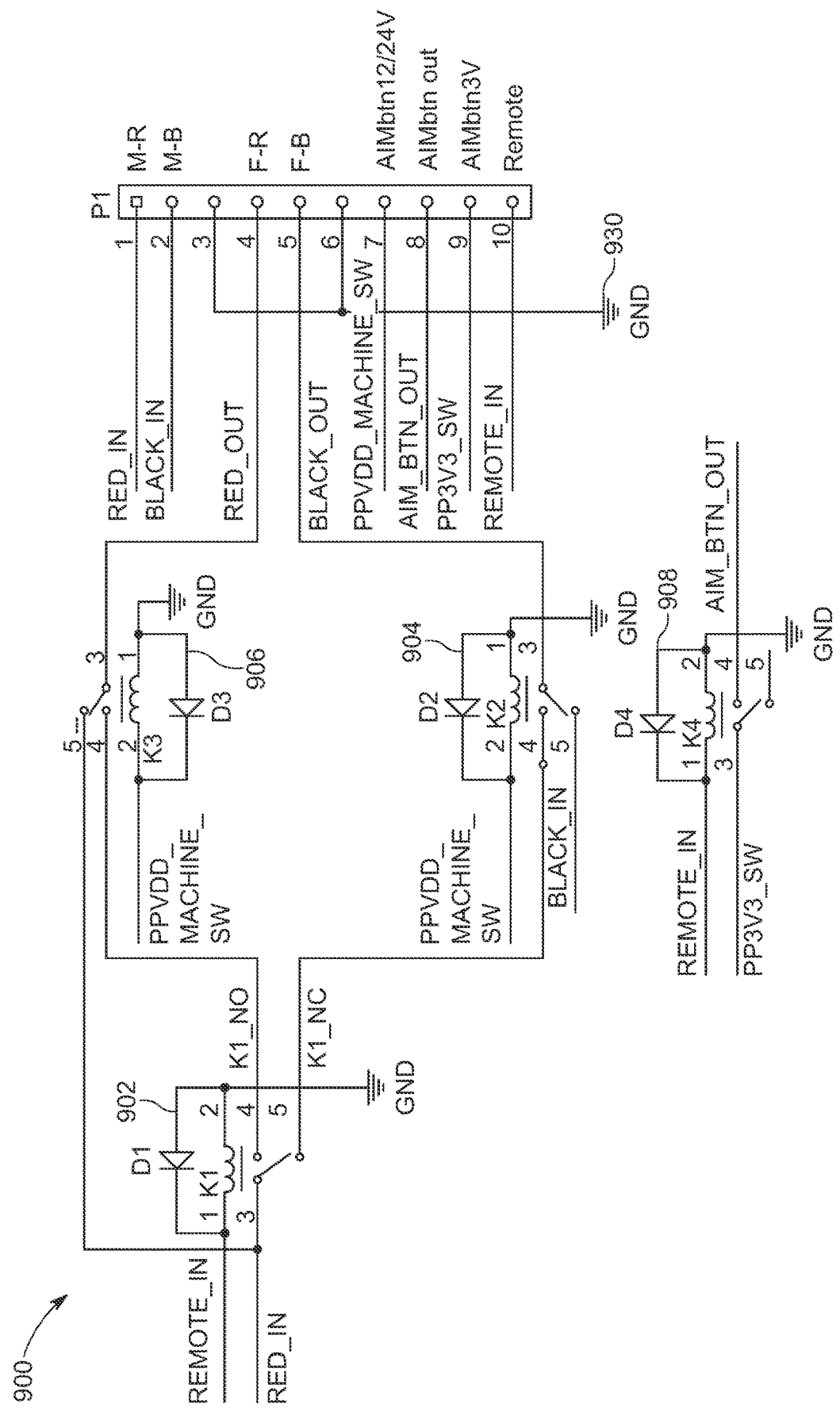
FIG. 9 shows a non-limiting example of a system using one or more solid-state relays to control a safety lever, in accordance with some embodiments.

FIG. 9 shows a non-limiting example of a system 900 using one or more solid-state relays, in accordance with some embodiments. In some embodiments, the system 900 includes connections to the safety lever of the EMV and allows AI controls to bypass the safety lever while enabling a safety remote to shut down the EMV in case of an emergency. The system 900 can include relays 902, 904, 906, and 908, a connector 930 (e.g., including one or more connectors (e.g., Deutsch 3-pin connectors) and male and female connectors), and an activation button (or switch) that can enable toggling between AI-operated or manually operated controlling of the EMV. The activation button can toggle between two different sets of outputs. The activation button can also be connected to a remote control that can be used to start and stop operation of the EMV and/or use AI to operate the EMV. Furthermore, although the diagram for a mechanical relay is used to describe the relays 902, 904, 906, and 908, this is for convenience only, and the relays 902-908 can include the solid state relays as discussed above. Accordingly, when it is described that a coil is energized or not energized, one of ordinary skill in the art will recognize that this is used to describe whether the TRG terminal of that relay has a high or low voltage.

In some embodiments, the system 900 can enable the toggling between a human or AI controlling the EMV. When the EMV is controlled by a human, the activation switch can be toggled to OFF. Then the safety lever in the joystick can be operated as a human sitting in the cab. In some embodiments, when the EMV is controlled by AI, the activation switch can be toggled to ON, where the 3.3V and +24/+12V inputs can be connected to the relays 902, 904, 906, and 908. This ON position can help bypass the safety lever of the EMV when the AI is controlling the EMV. In some embodiments, an LED can be connected to the +24/+12V wire connected to GND to indicate that AI is controlling the EMV (e.g., the LED is on) and a human is controlling the EMV (e.g., the LED is off).

Each of the relays 902, 904, 906, and 908 can include one of the relays 400, 500, 600, 700, or 800 discussed with respect to FIGS. 4-8. Accordingly, each of the relays has 5 pins including the COM terminal, TRG terminal, NC terminal, NO terminal, and GND.

In some embodiments, the relay 904 can function as the NO cable of a safety lever, and the relay 906 can function the NC cable of a safety lever. This can enable the relay 902 to switch between normally open and normally closed. Accordingly, although the mechanical safety lever is disabled, a similar function can be enabled by the use of multiple relays (e.g., relays 902, 904, 906, 908) that are connected to the mechanical lever.

On the EMVs, the safety lever that can be pulled up to operate the EMV (via human operator or AI) and pulled down to disable the machine (e.g., cease operations of the EMV). An AI operation activation button can be used to enable or disable the AI to operate the EMV. By using the system of FIGS. 9A and 9B, when the lever is pulled up, the human operator or the AI can operate the machine. Typically, an emergency stop can be enabled by a human operator by pulling the lever down. However, when the machine is being operated by AI, an actuator to push the lever down can be difficult and inefficient to implement, add weight to the machine, and add additional complicated controls to the system. Using the system 900, the use of an actuator can be avoided and instead, the emergency stop can be engaged electronically using the relays.

A mechanical relay system in an existing EMV can reconfigured to accommodate the solid state relay system that is deployed for the AI controlled system. For example, a mechanical relay can include an NC cable (RED_IN signal), an NO cable ( ) and COM cable (BLACK_IN signal).

Referring to relay 908, two controls can be provided. The REMOTE_IN signal can indicate whether the EMV is in operation or not (e.g., high signal means the EMV is in operation, and a low signal means the EMV is not in operation). The PP3V3_SW can indicate the activation button to enable the AI to control he EMV or the user to control the EMV (e.g., high means AI controlled, and low means human controlled) When the REMOTE_IN signal is high, the coil K4 is energized, and the relay 908 changes the connection between the COM terminal and NC terminal to NO terminal (NO mode). And when the PP3V3_SW is high, the ATM_BTN_OUT signal can also be high, which indicates that the AI is controlling the EMV.

When the coil K1 is not energized, the RED_IN signal is connected to the K1_NC signal (NC terminal). The RED_IN signal however is typically left floating, as the K1_NC signal is connected to the NO terminal of relay 904. When the user has engaged the EMV (e.g., REMOTE_IN is high), the coil K1 can be energized, and the relay 902 can switch the COM terminal (node 3) from the NC terminal (node 5) to the NO terminal (node 4).

The PPVDD_MACHINE_SW signal can include a signal that comes from the EMV once the activation button is turned on. Once the activation button is pressed, the PPVDD_MACHINE_SW signal goes high. When the signal is high, the relays 904 and 906 will switch over from normally closed to normally open, as the coils K2 and K3 are energized.

If the coil K1 and coil K3 are both energized, the RED_IN signal can be connected to the RED_OUT signal that feeds the connector 930. The RED_OUT signal can be provided to the main controller (or ECU) of the EMV.

If the coil on K2 is energized, the BLACK_IN signal can be provided to the BLACK_OUT signal, where the BLACK_IN is floating. This mimics the behavior of the safety lever.

Circuit Output Voltage

Figure 10:
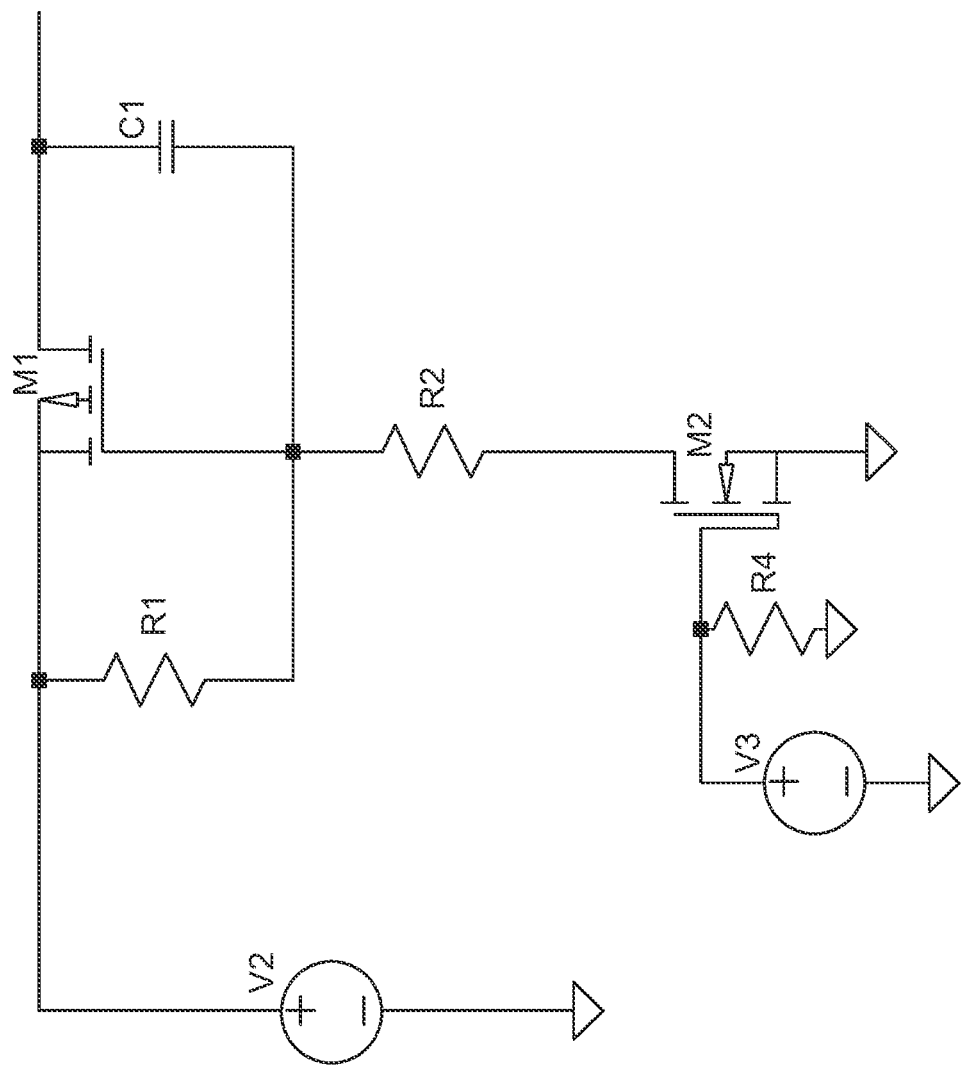
FIG. 10 shows a non-limiting example of a circuit providing a supply voltage, in accordance with some embodiments.

In some embodiments, the relays do not have to be powered separately and can be operated based at least in part on the power provided to the terminals of the relays. In some embodiments, the relays can be connected to a variable output stage that can amplify and/or matches a circuit supply voltage. example, FIG. 10 is a non-limiting example of a circuit 1000 providing a supply voltage, in accordance with some embodiments. The circuit 1000 can provide a supply voltage to the system 900 or be used with any of the relays 400, 500, 600, 700, or 800 to provide a variable output stage.

The circuit 1000 includes an amplifier circuit that can be used to provide voltages at a desired level. When using the relays described in FIGS. 4-9, there may be voltage drops within the circuit due to one or more of threshold voltage, source-drain voltages, diodes, and other circuit elements, since the different terminals and circuit elements are self-powered (e.g., using power from the terminals themselves, not a separate voltage source). The circuit 1000 can help ensure that the voltage provided at the output is the desired voltage. For example, if the system of FIG. 9 is operating at 24V, some of the output voltages may not be 24V as desired due to the voltage drops as described above. Accordingly, the circuit 1000 can help provide the 24V as output.

For example, if a high voltage is provided as input to the gate of the p-type transistor M2, the transistor M2 turns off, and the voltage of V2 can be provided to the output (source) of transistor M1 due to the transistor M1 being turned on. Similarly, if the gate input at the transistor M2 is low, the transistor M2 can be turned on and pull down the current from V2 to ground via the resistors R1, R2, and transistor M2. And the output from transistor M1 can be floating or 0V.

Accordingly, the circuit 1000 can be added to each of the final outputs of each of the outputs of the circuit 1000. The voltage of V2 can be modified depending on embodiments (12V, 3.3V, etc.).

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A solid-state relay system, comprising:
   a first solid-state device electrically connected to a first input, wherein the first input is electrically connected to a common node;
   a second solid-state device electrically connected to a second input, wherein the second input is electrically disconnected from the common node; and
   a set of solid-state devices configured to, based at least in part on a trigger signal, electrically disconnect the first input from a common node and electrically connect the second input to the common node,
   wherein the first solid-state device, the second solid-state device, and the set of solid-state devices are powered by the first input, the second input, and the trigger signal without using an external power source,
   wherein a voltage level of the first input is greater than a voltage level of the common node in a first mode and the voltage level of the common node is greater than the voltage level of the first input in a second mode, and
   wherein a voltage level of the second input is greater than the voltage level of the common node in a first mode and the voltage level of the common node is greater than the voltage level of the second input in a second mode.

2. The solid-state relay system of claim 1, wherein one or more of the first solid-state device, the second solid-state device, and the set of solid-state devices are protected from polarity reversals when receiving the first input, the second input, and the trigger signal.

3. The solid-state relay system of claim 2, wherein the set of solid-state devices comprises a third solid-state device configured to, based at least in part on the trigger signal, turn on when a fourth solid-state device of the set of solid-state devices is turned on.

4. The solid-state relay system of claim 3, wherein the first solid-state device is configured to turn off when the third solid-state device is turned on.

5. The solid-state relay system of claim 4, wherein the set of solid-state devices comprises a fifth solid-state device configured to turn on when the third solid-state device is turned on.

6. The solid-state relay system of claim 5, wherein the set of solid-state devices comprises a sixth solid-state device configured to turn on when the fifth solid-state device is turned on.

7. The solid-state relay system of claim 6, wherein the second solid-state device is configured to turn on when the sixth solid-state device is turned on.

8. The solid-state relay system of claim 7, wherein the fourth solid-state device is configured to turn on when a first light-emitting diode (LED) is turned on based at least in part on the trigger signal, and wherein the fifth solid-state device is configured to turn on when a second LED is turned on based at least in part on the trigger signal.

9. The solid-state relay system of claim 8, wherein the fourth solid-state device and the first LED form a first opto-coupler, and the fifth solid-state device and the second LED form a second opto-coupler.

10. The solid-state relay system of claim 8, wherein each of the first and second LEDs is configured to emit a light having a wavelength in an infrared range.

11. The solid-state relay system of claim 1, wherein the set of solid-state devices comprises a third solid-state device configured to receive the trigger signal, and wherein the second solid-state device is configured, based at least in part on the trigger signal, turn on when the third solid-state device is turned on.

12. The solid-state relay system of claim 11, wherein the set of solid-state devices comprises a fourth solid-state device configured to receive the trigger signal, and wherein the first solid-state device is configured to, based at least in part on the trigger signal, turn off when the fourth solid-state device is turned on.

13. The solid-state relay system of claim 1, further comprising a first diode electrically connected to the first solid-state device and the common node.

14. The solid-state relay system of claim 13, further comprising a second diode electrically connected to the first input, wherein the set of solid-state devices comprises a seventh solid-state device electrically connected to the second diode and the common node.

15. The solid-state relay system of claim 14, further comprising a third diode electrically connected to the common node and the second solid-state device.

16. The solid-state relay system of claim 15, further comprising:
   a fourth diode electrically connected to the second input, wherein the set of solid-state devices comprises an eighth solid-state device electrically connected to the fourth diode and the common node; and a fifth diode electrically connected to the first input, a sixth diode electrically connected to the second input, and a seventh diode electrically connected to the common node, wherein the fifth, sixth and seventh diodes are electrically connected to one another.

17. The solid-state relay system of claim 14, wherein the first and second solid-state devices and the set of solid-state devices are powered by one or more of the first input, second input, and/or the trigger signal, without an external power source, and wherein each of the one or more diodes includes a Zener diode or a rectifier diode.

18. The solid-state relay system of claim 1, wherein the first, second, and set of solid-state devices each includes a transistor including a bipolar junction transistor (BJT) or a metal-oxide-semiconductor field-effect transistor (MOSFET), and wherein the BJT includes an NPN transistor, and wherein the MOSFET includes an n-type transistor.

19. The solid-state relay system of claim 1, wherein the set of solid-state devices configured to, when there is no trigger signal, electrically disconnect the second input from the common node and electrically connect the first input to the common node.

\* \* \* \* \*